US012787269B2

(12) United States Patent
Lim et al.

(10) Patent No.: US 12,787,269 B2
(45) Date of Patent: Nov. 3, 2026

(54) SEMICONDUCTOR DEVICE INCLUDING PERIPHERAL INSULATING STRUCTURE

(71) Applicant: SAMSUNG ELECTRONICS CO., LTD., Suwon-si (KR)

(72) Inventors: Dongkyun Lim, Suwon-si (KR); Kyumin Kim, Suwon-si (KR); Hyejin Kim, Suwon-si (KR); Seungyoon Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 18/654,257

(22) Filed: May 3, 2024

(65) Prior Publication Data

US 2024/0431098 A1 Dec. 26, 2024

(30) Foreign Application Priority Data

Jun. 21, 2023 (KR) ........................ 10-2023-0079533

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02)

(58) Field of Classification Search
CPC ...... H10B 12/50; H10B 12/09; H10B 12/315; H10B 12/0335; H10B 12/482; H10B 12/485
See application file for complete search history.

(56) References Cited

U.S. PATENT DOCUMENTS

2006/0141670 A1 6/2006 Yong
2010/0151638 A1 6/2010 Clevenger et al.
2010/0167539 A1 7/2010 Eun
2015/0179259 A1 6/2015 Kim et al.
2015/0214152 A1 7/2015 Park et al.
(Continued)

FOREIGN PATENT DOCUMENTS

KR 10-2006-0006336 A 1/2006
KR 10-2006-0075750 A 7/2006
(Continued)

*Primary Examiner* — Thanh Y. Tran
(74) *Attorney, Agent, or Firm* — Fish & Richardson P.C.

(57) ABSTRACT

A semiconductor device includes bitlines on a cell region of a substrate; a contact plug between the bitlines; a landing pad on the contact plug; a peripheral gate on a peripheral circuit region of the substrate; a lower interlayer insulating layer covering a side surface of the peripheral gate; a peripheral contact plug penetrating through the lower interlayer insulating layer; peripheral interconnection layers on the lower interlayer insulating layer and the peripheral contact plug; and peripheral insulating structures passing between the peripheral interconnection layers, wherein the peripheral insulating structures include a first peripheral insulating structure partially penetrating through the lower interlayer insulating layer, and wherein the first peripheral insulating structure includes a first peripheral insulating layer, a second peripheral insulating layer on the first peripheral insulating layer and passing between the peripheral interconnection layers, and a mixture layer between the lower interlayer insulating layer and the first peripheral insulating layer.

20 Claims, 35 Drawing Sheets

(56) References Cited

U.S. PATENT DOCUMENTS

| | | | | |
|---|---|---|---|---|
| 2018/0012775 | A1 | 1/2018 | Byun et al. | |
| 2018/0219010 | A1 | 8/2018 | Kim et al. | |
| 2021/0082924 | A1 | 3/2021 | Seong et al. | |
| 2021/0335789 | A1 | 10/2021 | Zhu | |
| 2021/0375764 | A1 | 12/2021 | Song et al. | |
| 2023/0045674 | A1 | 2/2023 | Jang et al. | |
| 2023/0209802 | A1* | 6/2023 | Lee | H10B 12/09 438/700 |
| 2025/0227921 | A1* | 7/2025 | Feng | H10B 12/315 |

FOREIGN PATENT DOCUMENTS

| | | | |
|---|---|---|---|
| KR | 10-2010-0076705 | A | 7/2010 |
| KR | 10-2010-0122904 | A | 11/2010 |
| KR | 10-2015-0073613 | A | 7/2015 |
| KR | 10-2015-0089839 | A | 8/2015 |
| KR | 10-2018-0005507 | A | 1/2018 |
| KR | 10-2018-0032359 | A | 3/2018 |
| KR | 10-2018-0071463 | A | 6/2018 |
| KR | 10-2021-0032843 | A | 3/2021 |
| KR | 10-2021-0044282 | A | 4/2021 |
| KR | 10-2023-0022322 | A | 2/2023 |

* cited by examiner

SEMICONDUCTOR DEVICE INCLUDING PERIPHERAL INSULATING STRUCTURE

CROSS-REFERENCE TO RELATED APPLICATION

This application claims benefit of priority to Korean Patent Application No. 10-2023-0079533, filed on Jun. 21, 2023, in the Korean Intellectual Property Office, the disclosure of which is incorporated herein by reference in its entirety.

BACKGROUND

1. Field

Example embodiments relate to a semiconductor device including a peripheral insulating structure.

2. Description of the Related Art

The demand for high performance, high speed, and/or multifunctionality of a semiconductor device has increased, causing an increase in integration density of a semiconductor device. In manufacturing a semiconductor device having a fine pattern corresponding to the trend for high integration density of a semiconductor device, it may be desired to implement patterns having a fine width or a fine spacing distance.

SUMMARY

According to an example embodiment, a semiconductor device may include a substrate including a cell region and a peripheral circuit region; bitline structures disposed on the cell region; a contact plug disposed between the bitline structures; a landing pad structure disposed on the contact plug; a peripheral gate structure disposed on the peripheral circuit region; a lower interlayer insulating layer covering a side surface of the peripheral gate structure; a peripheral contact plug penetrating through the lower interlayer insulating layer; a plurality of peripheral interconnection layers on the lower interlayer insulating layer and the peripheral contact plug; and a plurality of peripheral insulating structures passing between the plurality of peripheral interconnection layers, wherein the plurality of peripheral insulating structures include a first peripheral insulating structure partially penetrating through the lower interlayer insulating layer, and wherein the first peripheral insulating structure includes a first peripheral insulating layer, a second peripheral insulating layer disposed on the first peripheral insulating layer and passing between the plurality of peripheral interconnection layers, and a mixture layer between the lower interlayer insulating layer and the first peripheral insulating layer.

According to an example embodiment, a semiconductor device may include a substrate including a cell region and a peripheral circuit region; bitline structures disposed on the cell region; a first contact plug and a second contact plug disposed between the bitline structures and spaced apart from each other; a spacer structure disposed on a side surface of one of the bitline structures and in contact with the second contact plug; a first landing pad structure disposed on the first contact plug and including a first lower landing pad and a first upper landing pad on the first lower landing pad; a second landing pad structure disposed on the second contact plug and including a second lower landing pad and a second upper landing pad on the second lower landing pad; a cell insulating pattern between the first landing pad structure and the second landing pad structure; a peripheral gate structure disposed on the peripheral circuit region; a lower interlayer insulating layer covering a side surface of the peripheral gate structure; a peripheral contact plug penetrating through the lower interlayer insulating layer; a plurality of peripheral interconnection layers on the lower interlayer insulating layer and the peripheral contact plug; and a plurality of peripheral insulating structures passing between the plurality of peripheral interconnection layers and partially penetrating through the lower interlayer insulating layer, wherein a lower surface of the cell insulating pattern includes a first portion in contact with an upper surface of the spacer structure and a second portion in contact with the second lower landing pad, and wherein a lower end of the second portion of the cell insulating pattern is disposed on a lower level than a lower end of the first portion of the cell insulating pattern.

According to an example embodiment, a semiconductor device may include a substrate including a cell region and a peripheral circuit region; a first active region disposed on the substrate in the cell region; a cell gate structure disposed in the substrate in the cell region, intersecting the first active region and extending in a first horizontal direction; bitline structures intersecting the cell gate structure and extending in a second horizontal direction intersecting the first horizontal direction; a contact plug disposed between the bitline structures; a landing pad structure disposed on the contact plug and including a lower landing pad and an upper landing pad on the lower landing pad; a peripheral gate structure disposed on the peripheral circuit region; a lower interlayer insulating layer covering a side surface of the peripheral gate structure; a peripheral contact plug penetrating through the lower interlayer insulating layer; a plurality of peripheral interconnection layers on the lower interlayer insulating layer and the peripheral contact plug; and a plurality of peripheral insulating structures passing between the plurality of peripheral interconnection layers, wherein the plurality of peripheral insulating structures include a first peripheral insulating structure partially penetrating through the lower interlayer insulating layer, wherein the first peripheral insulating structure includes a first peripheral insulating layer, a second peripheral insulating layer disposed on the first peripheral insulating layer and penetrating through the peripheral interconnection layer, and a mixture layer between the lower interlayer insulating layer and the first peripheral insulating layer, wherein the lower interlayer insulating layer and the first peripheral insulating layer include silicon oxide, and wherein the mixture layer and the second peripheral insulating layer include silicon nitride.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, embodiments will be described as follows with reference to the accompanying drawings.

Figure 1:
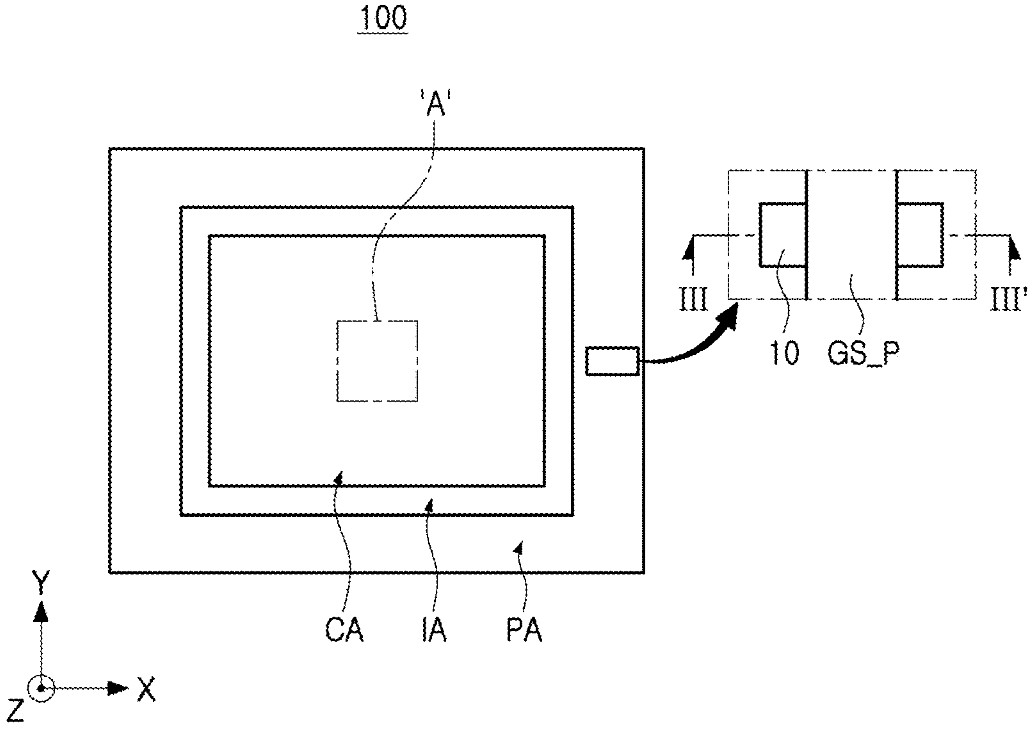
FIG. 1 is a plan diagram illustrating a semiconductor device according to an example embodiment.

FIG. 1 is a plan diagram illustrating a semiconductor device according to an example embodiment.

Referring to FIG. 1, a semiconductor device 100 according to an example embodiment may include a cell region CA, an interface region IA, and a peripheral circuit region PA. The peripheral circuit region PA may be disposed to surround the cell region CA, and the interface region IA may be disposed between the cell region CA and the peripheral circuit region PA. The cell region CA may refer to a region in which a memory cell of a dynamic random access memory (DRAM) device is disposed, and in a peripheral circuit region PA, wordline drivers, sense amplifiers, row and column decoders and control circuits may be disposed. The interface region IA may electrically connect the cell region CA to the peripheral circuit region PA.

Figure 2:
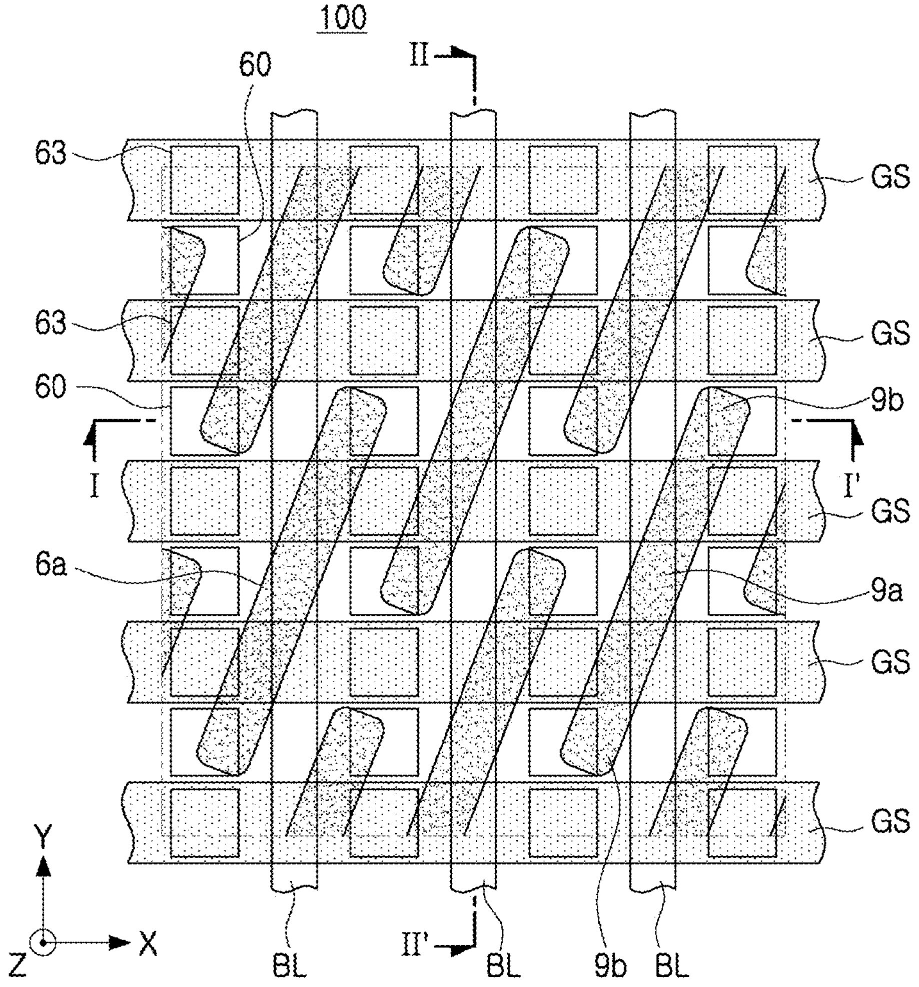
FIG. 2 is an enlarged top view of region 'A' in FIG. 1.
Figure 3A:
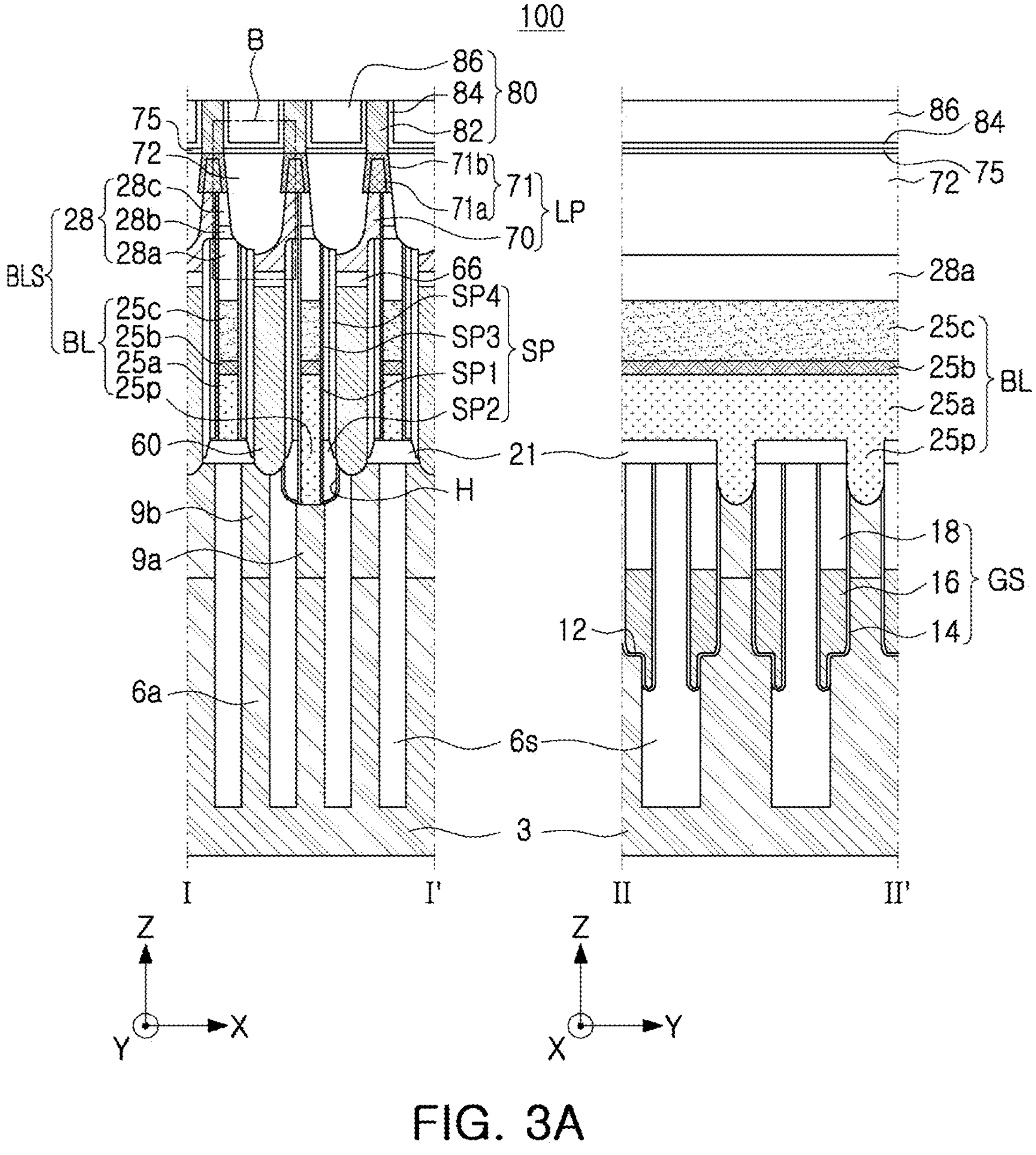
FIG. 3A is cross-sectional view along lines I-I' and II-II' in FIG. 2.
Figure 3B:
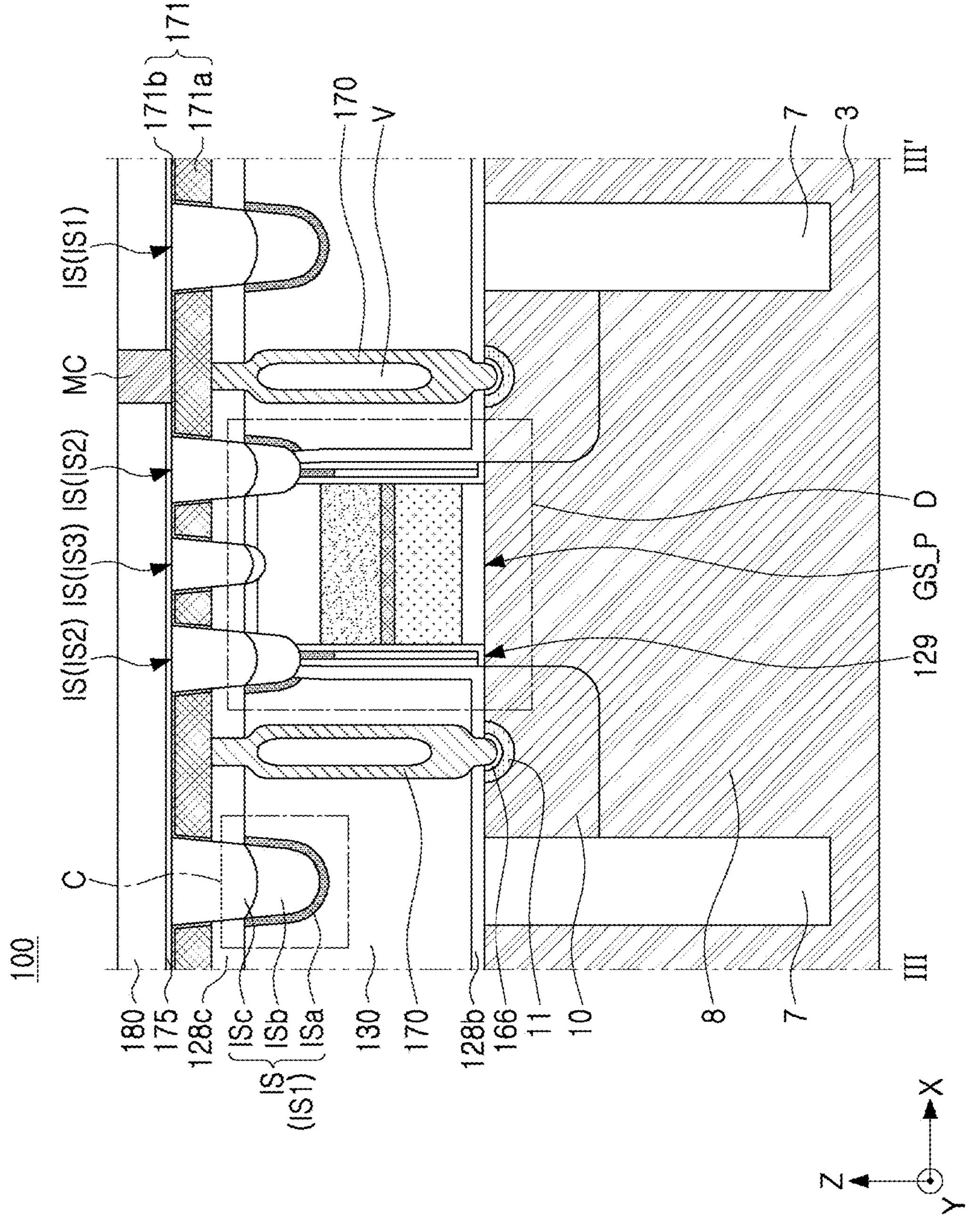
FIG. 3B is a cross-sectional view along line III-III' in FIG. 1.
Figure 4:
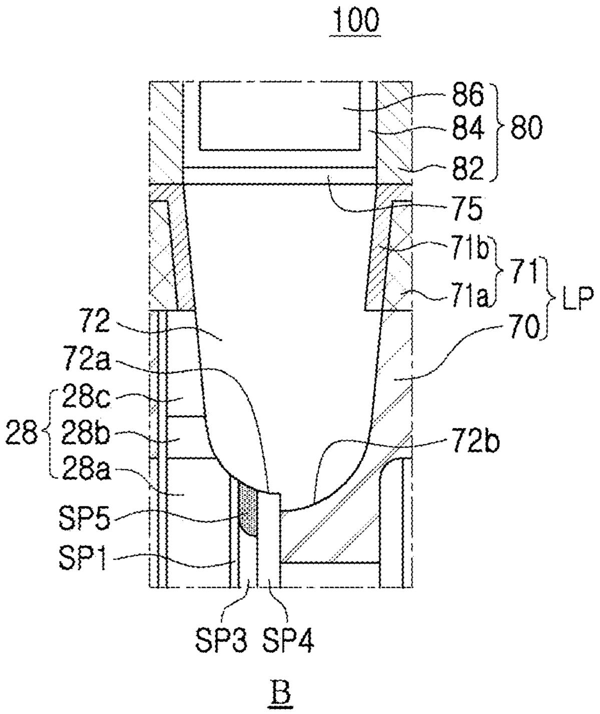
FIG. 4 is an enlarged view of region 'B' in FIG. 3A.
Figure 5A:
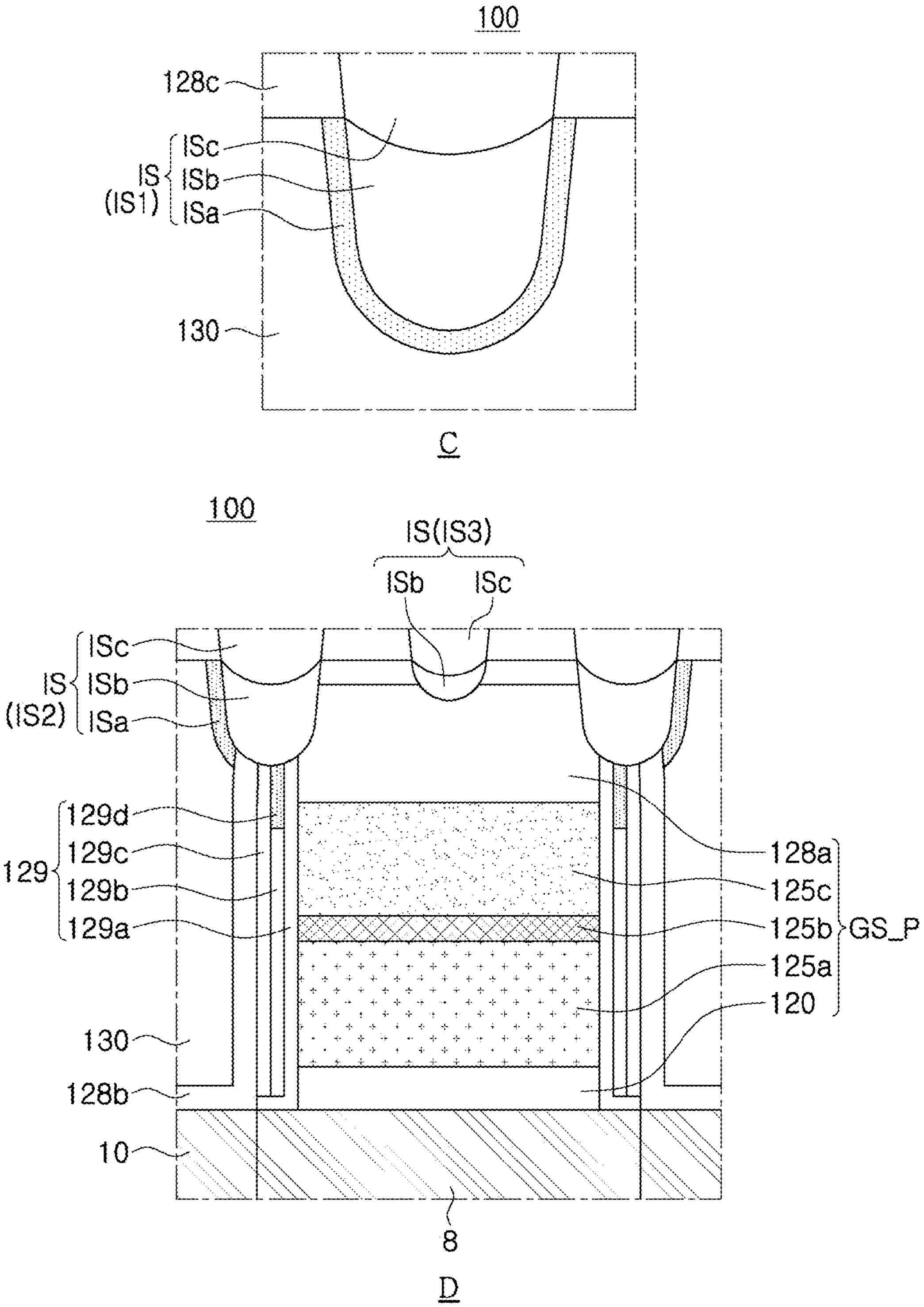
FIG. 5A illustrates enlarged view of regions 'C' and 'D' in FIG. 3B.

FIG. 2 is an enlarged diagram illustrating region 'A' of the semiconductor device illustrated in FIG. 1. FIG. 3A is cross-sectional view along lines I-I' and II-II' of FIG. 2. FIG. 3B is a cross-sectional view along line III-III' of FIG. 1. FIG. 4 is an enlarged diagram illustrating region 'B' in FIG. 3A. FIG. 5A is an enlarged diagram illustrating regions 'C' and 'D' in FIG. 3B.

Referring to FIGS. 2 to 5, the semiconductor device 100 according to the example embodiment may include a cell gate structure GS disposed in a substrate 3, a buffer layer 21 disposed on the substrate 3, a bitline structure BLS, a spacer structure SP, a contact plug 60, a landing pad structure LP, a cell insulating pattern 72, and a capacitor structure 80 in the cell region CA. For example, the semiconductor device 100 may be applied to a cell array of dynamic random access memory (DRAM). The semiconductor device 100 may further include a peripheral gate structure GS_P disposed on the substrate 3, a lower interlayer insulating layer 130, a peripheral contact plug 170, a peripheral interconnection layer 171, and a peripheral insulating structure IS in the peripheral circuit region PA.

In detail, the substrate 3 may include a semiconductor material, e.g., a group IV semiconductor, a group III-V compound semiconductor, or a group II-VI compound semiconductor. For example, the group IV semiconductor may include silicon, germanium or silicon-germanium. The substrate 3 may be configured as a silicon substrate, a silicon on insulator (SOI) substrate, a germanium substrate, a germanium on insulator (GOI) substrate, a silicon-germanium substrate, or a substrate including an epitaxial layer.

In the cell region CA, the substrate 3 may include a first active region 6*a*, a first device isolation layer 6*s*, a first impurity region 9*a* and a second impurity region 9*b*. The first device isolation layer 6*s* may be an insulating layer extending downwardly from the upper surface of the substrate 3 and may define the first active region 6*a*. For example, the first active region 6*a* may correspond to a portion of an upper surface of the substrate 3 surrounded by the first device isolation layer 6*s*. In a plan diagram, the first active region 6*a* may have a bar shape having a minor axis and a major axis, and may extend in directions inclined with respect to the X-direction and the Y-direction. The first device isolation layer 6*s* may include, e.g., silicon oxide, silicon nitride, silicon oxynitride, or a combination thereof, and may include a single layer or a plurality of layers.

The first active region may include first and second impurity regions 9*a* and 9*b* extending from an upper surface of the substrate 3 to a predetermined depth. The first and second impurity regions 9*a* and 9*b* may be spaced apart from each other. The first and second impurity regions 9*a* and 9*b* may be provided as source/drain regions of the transistor. For example, for one first active region 6*a*, two cell gate structures GS may intersect the one first active region 6*a*, a drain region may be formed between the two cell gate structures GS, and source regions may be formed in regions opposite to the drain region for the two cell gate structures GS. For example, the first impurity region 9*a* may correspond to the drain region, and the second impurity region 9*b* may correspond to the source region. The source region and the drain region may be formed by the first and second impurity regions 9*a* and 9*b* by doping or ion implantation of substantially the same impurities, and may be referred to interchangeably depending on the circuit configuration of a finally formed transistor. The first and second impurity regions 9*a* and 9*b* may include impurities having conductivity opposite to that of the substrate 3. For example, the first active regions 6*a* may include P-type impurities, and the first and second impurity regions 9*a* and 9*b* may include N-type impurities.

In the cell region CA, the cell gate structures GS may extend in the X-direction and may be spaced apart from each other in the Y-direction. Also, the cell gate structures GS may intersect the first active region 6*a*. For example, two cell gate structures GS may intersect the first active region 6*a*. Transistors each including the cell gate structure GS and the first and second impurity regions 9*a* and 9*b* may form a buried channel array transistor (BCAT).

In the cross-sectional diagram, the cell gate structures GS may be buried in the substrate 3, e.g., the cell gate structures GS may be disposed in the gate trench 12 formed in the substrate 3. The cell gate structure GS may include a cell gate dielectric layer 14, a gate electrode 16 and a gate capping layer 18 disposed in the gate trench 12. The cell gate dielectric layer 14 may be conformally formed on an internal wall of the gate trench 12. The gate electrode 16 may be disposed on a lower portion of the gate trench 12, and the gate capping layer 18 may be disposed on an upper portion of the cell gate structure GS and may fill the gate trench 12.

The cell gate dielectric layer 14 may include, e.g., silicon oxide or a material having high-K material. In example embodiments, the cell gate dielectric layer 14 may be formed by oxidizing the first active region 6*a* or may be formed by deposition. The gate electrode 16 may include a conductive material, e.g., at least one of polycrystalline silicon (Si), titanium (Ti), titanium nitride (TiN), tantalum (Ta), tantalum nitride (TaN), tungsten (W), tungsten nitride (WN), and aluminum (Al). The gate capping layer 18 may include, e.g., silicon nitride.

In the cell region CA, the buffer layer 21 may be disposed on the first active region 6*a*, the first device isolation layer 6*s*, and the cell gate structure GS. The buffer layer 21 may include, e.g., silicon oxide, silicon nitride, silicon oxynitride, or a combination thereof. The buffer layer 21 may be configured as a single layer or multiple layers.

In the cell region CA, the bitline structures BLS may extend in the Y-direction and may be spaced apart from each other in the X-direction. The bitline structure BLS may have a bar shape extending in the Y-direction. The bitline structure BLS may include a bitline BL and a bitline capping layer 28 on the bitline BL. The bitline BL may include a first conductive layer 25*a*, a second conductive layer 25*b*, and a third conductive layer 25*c* stacked in order on the buffer layer 21. The first conductive layer 25*a* may include polysilicon. The second conductive layer 25*b* may include a metal-semiconductor compound. The metal-semiconductor compound may be, e.g., a layer obtained by siliciding a portion of the first conductive layer 25*a*. For example, the metal-semiconductor compound may include cobalt silicide (CoSi), titanium silicide (TiSi), nickel silicide (NiSi), tungsten silicide (WSi), or other metal silicides, or may include nitrides, e.g., TiSiN. The third conductive layer 25*c* may include a metal material, e.g., titanium (Ti), tantalum (Ta), tungsten (W), and aluminum (Al). The bitline BL may further include a plug portion 25*p* disposed below the first conductive layer 25*a* and extending downwardly, and in contact with the second impurity region 9*b*. The plug portion 25*p* may be disposed in the contact hole H formed on an upper surface of the substrate 3. In a plan diagram, the plug portion 25*p* may be in contact with the central portion of first active region 6*a*. The plug portion 25*p* may electrically connect the first active region 6*a* to the bitline structure BLS. The plug portion 25*p* may include the same material as that of the first conductive layer 25*a*.

The bitline capping layer 28 may include a first capping layer 28*a*, a second capping layer 28*b*, and a third capping layer 28*c* stacked in order on the bitline BL. A side surface of the first capping layer 28*a* may be coplanar with the first conductive layer 25*a*, the second conductive layer 25*b*, and the third conductive layer 25*c*. The first capping layer 28*a*, the second capping layer 28*b*, and the third capping layer 28*c* may include, e.g., silicon oxide, silicon nitride, silicon oxynitride, or a combination thereof.

The spacer structures SP may be disposed on both side surfaces of the bitline structures BLS, respectively, and may extend in the Y-direction alongside surfaces of the bitline structures BLS. The spacer structure SP may include a first spacer SP1, a second spacer SP2, a third spacer SP3 and a fourth spacer SP4 disposed on the side surface of the bitline structures BLS. The first spacer SP1 may be conformally disposed along the side surfaces of the bitline structure BLS and the contact hole H. The second spacer SP2 may be disposed on the first spacer SP1 and may fill the contact hole H. The third spacer SP3 may cover a side surface of the first spacer SP1, and the fourth spacer SP4 may cover a side surface of the third spacer SP3. The third spacer SP3 and the fourth spacer SP4 may cover an upper surface of second spacer SP2. The first spacer SP1, the second spacer SP2, the third spacer SP3, and the fourth spacer SP4 may include, e.g., silicon oxide, silicon nitride, silicon oxynitride, or a combination thereof. For example, the first spacer SP1 and the fourth spacer SP4 may include at least one of SiN, SiCN, SiON and SiOCN. The third spacer SP3 may include silicon oxide.

As illustrated in FIG. 4, the spacer structure SP may further include a mixture layer SP5 disposed on the third spacer SP3 and in contact with the cell insulating pattern 72. In an example embodiment, the mixture layer SP5 may include silicon oxide and silicon nitride, and may be formed by nitriding a portion of the third spacer SP3. In the mixture layer SP5, silicon oxide and silicon nitride may not be spatially isolated from each other and may be mixed with each other. The mixture layer SP5 may include at least one of $SiO_2$, SiN and SiON.

Figure 5B:
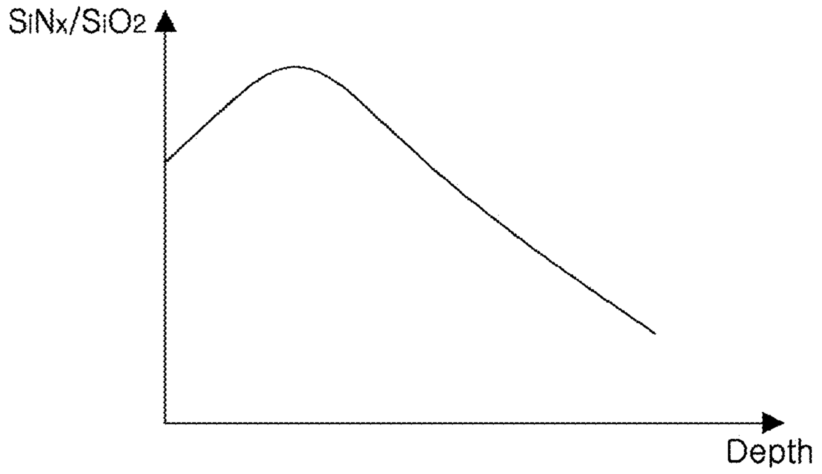
FIG. 5B is a graph indicating a ratio of silicon nitride of a mixture layer.

FIG. 5B is a graph indicating a ratio of silicon nitride of the mixture layer SP5.

Referring to FIG. 5B, in an example embodiment, a ratio of silicon nitride to silicon oxide in the mixture layer SP5 may vary depending on a depth. For example, the ratio may have a maximum value at a specific depth. In example embodiments, “depth” may refer to a distance in a direction oriented away from an upper surface.

Referring back to FIG. 3A, the contact plug 60 may be disposed between the bitline structures BLS and may be in contact with the spacer structures SP. Viewed in a plan diagram, the contact plugs 60 may be disposed between the bitline structures BLS and between the cell gate structures GS.

A lower end of the contact plug 60 may be disposed on a lower level than an upper surface of the substrate 3, and an upper surface of the contact plug 60 may be disposed on a lower level than the upper end of the bitline structure BLS, e.g., relative to a bottom of the substrate 3. The contact plug 60 may extend into the substrate 3, may be in contact with the second impurity region 9*b* of the first active region 6*a*, and may be electrically connected to the second impurity region 9*b*. The contact plug 60 may be formed of a conductive material, e.g., polysilicon (Si), titanium (Ti), titanium nitride (TiN), tantalum (Ta), tantalum nitride (TaN), tungsten (W), tungsten nitride (WN), and aluminum (Al). In an example embodiment, the contact plug 60 may include doped polysilicon and may include N-type impurities, e.g., phosphorus (P), arsenic (Aa) and antimony (Sb).

The semiconductor device 100 may further include a fence structure 63 disposed between the bitline structures BLS, as illustrated in FIG. 2. In the plan diagram, fence structures 63 may vertically overlap the cell gate structures GS, and may be alternately arranged with the contact plugs 60 in the Y-direction. The fence structures 63 may spatially isolate the contact plugs 60 from each other and may electrically insulate the contact plugs 60 from each other. The fence structure 63 may have a bar shape or a column shape extending in a vertical direction. Although not illustrated, the lower surface of the fence structure 63 may be in contact with the gate capping layer 18 of the cell gate structure GS. The fence structure 63 may include an insulating material, e.g., silicon nitride.

The semiconductor device 100 may further include a metal-semiconductor compound layer 66 disposed on an upper surface of the contact plug 60. The metal-semiconductor compound layer 66 may be in contact with a side surface of the spacer structure SP. The metal-semiconductor compound layer 66 may be formed by siliciding a portion of the contact plug 60 including polysilicon. The metal-semiconductor compound layer 66 may include, e.g., cobalt silicide (CoSi), titanium silicide (TiSi), nickel silicide (NiSi), tungsten silicide (WSi), or other metal silicide.

The landing pad structure LP may be disposed on the metal-semiconductor compound layer 66. The landing pad structure LP may include a lower landing pad 70 and an upper landing pad 71. The upper landing pad 71 may be electrically connected to the lower landing pad 70, and the landing pad structure LP may be electrically connected to the second impurity region 9*b* of the first active region 6*a* through the contact plug 60. The lower landing pad 70 may include a metal nitride, e.g., titanium nitride (TiN).

The upper landing pad 71 may be disposed on the lower landing pad 70. In an example embodiment, the upper landing pad 71 may have a tapered cylinder shape. For example, a lower surface of the upper landing pad 71 may be wider than an upper surface of the upper landing pad 71, and a horizontal width of the upper landing pad 71 may decrease upwardly. The upper landing pad 71 may include a metal layer 71*a* and a metal nitride layer 71*b*. The metal nitride layer 71*b* may cover the metal layer 71*a*. For example, the metal nitride layer 71*b* may extend along a side surface and an upper surface of the upper landing pad 71 and may cover a side surface and an upper surface of the metal layer 71*a*. The lower surface of the metal nitride layer 71*b* may be coplanar with a lower surface of the metal layer 71*a*. The metal layer 71*a* may include, e.g., at least one of titanium (Ti), tantalum (Ta), tungsten (W), molybdenum (Mo), ruthenium (Ru), and aluminum (Al). For example, the metal layer 71*a* may include tungsten (W). The metal nitride layer 71*b* may include, e.g., at least one of titanium nitride (TiN), tantalum nitride (TaN), tungsten nitride (WN), molybdenum nitride (MoN), ruthenium nitride (RUN) and aluminum nitride (AlN).

In the cell region CA, the cell insulating pattern 72 may be disposed between the landing pad structures LP. The cell insulating pattern 72 may spatially isolate the landing pad structures LP from each other and may electrically insulate the landing pad structures LP from each other. The cell insulating pattern 72 may be in contact with the bitline structure BLS, the spacer structure SP, the lower landing pad 70, and the upper landing pad 71. In an example embodiment, the cell insulating pattern 72 may have step differences. For example, a portion of a lower surface of the cell insulating pattern 72 may protrude toward the lower landing pad 70 in a region in which the spacer structure SP and the lower landing pad 70 are in contact with each other. A portion of the cell insulating pattern 72 may be in contact with a side surface of the spacer structure SP. For example, a lower surface of the cell insulating pattern 72 may include a first portion 72*a* in contact with an upper surface of the spacer structure SP and a second portion 72*b* in contact with the lower landing pad 70. A lower end of the second portion 72*b* may be disposed on a lower level than the lower end of the first portion 72*a*, e.g., relative to a bottom of the substrate 3. The side surface of the fourth spacer SP4 may be in contact (e.g., direct contact) with both the lower landing pad 70 and the cell insulating pattern 72.

Also, a portion of the side surface of the cell insulating pattern 72 may protrude toward the lower landing pad 70 in a region in which the lower landing pad 70 and the upper landing pad 71 are in contact with each other. A portion of the cell insulating pattern 72 may be in contact with a lower surface of the upper landing pad 71. For example, the cell insulating pattern 72 may be in contact with only the metal nitride layer 71*b* of the upper landing pad 71. In another example, a portion of the cell insulating pattern 72 may be in contact with a lower surface of the metal layer 71*a*.

The cell insulating pattern 72 may include, e.g., silicon oxide, silicon nitride, silicon oxynitride, or a combination thereof. For example, the cell insulating pattern 72 may include silicon nitride.

In the cell region CA, the semiconductor device 100 may further include an etch stop layer 75 covering an upper surface of the cell insulating pattern 72. The capacitor structure 80 may be disposed on the landing pad structure LP and the cell insulating pattern 72. The capacitor structure 80 may include a lower electrode 82, a capacitor dielectric layer 84, and an upper electrode 86. The lower electrode 82 may penetrate through the etch stop layer 75 and may be in contact with an upper surface of the landing pad structure LP. The capacitor dielectric layer 84 may cover the lower electrode 82 and the etch stop layer 75, and the upper electrode 86 may cover the capacitor dielectric layer 84. The capacitor structure 80 may be electrically connected to the landing pad structure LP and the contact plug 60.

The lower electrode 82 and the upper electrode 86 may include, e.g., at least one of a doped semiconductor, a metal nitride, a metal, and a metal oxide. The lower electrode 82 and the upper electrode 86 may include, e.g., at least one of polycrystalline silicon, titanium nitride (TiN), tungsten (W), titanium (Ti), ruthenium (Ru), and tungsten nitride (WN). For example, the capacitor dielectric layer 84 may include at least one high-K material, e.g., zirconium oxide ($ZrO_2$), aluminum oxide ($Al_2O_3$), and hafnium oxide ($Hf_2O_3$).

In the peripheral circuit region PA, the substrate 3 may further include a second device isolation layer 7, a second active region 8, a first peripheral impurity region 10, and a second peripheral impurity region 11. The second device isolation layer 7 may be an insulating layer extending downwardly from an upper surface of the substrate 3 and may define the second active region 8. For example, the second active region 8 may correspond to a portion of an upper surface of the substrate 3 surrounded by the second device isolation layer 7. The second active region 8 may include the first peripheral impurity region 10 and the second peripheral impurity region 11 extending from an upper surface of the substrate 3 to a predetermined depth. The first peripheral impurity regions 10 may be spaced apart from each other with the peripheral gate structure GS_P interposed therebetween. The second peripheral impurity region 11 may be disposed in the first peripheral impurity region 10.

The second device isolation layer 7 may include, e.g., silicon oxide, silicon nitride, silicon oxynitride, or a combination thereof, and may include a single layer or a plurality of layers. The first peripheral impurity region 10 may include, e.g., N-type impurities or P-type impurities. The second peripheral impurity region 11 may include impurities of the same conductivity as that of the first peripheral impurity region 10, and the concentration of impurities of the second peripheral impurity region 11 may be greater than that of the first peripheral impurity region 10.

In the peripheral circuit region PA, the peripheral gate structure GS_P may be disposed on the second active region 8. The peripheral gate structure GS_P may have a structure similar to that of the bitline BL and may be formed of a material similar to that of the bitline BL, but may have a wider horizontal width in the X-direction than that of the bitline BL.

The peripheral gate structure GS_P may include a peripheral gate dielectric layer 120, a first conductive layer 125*a*, a second conductive layer 125*b*, a third conductive layer 125*c*, and a peripheral gate capping layer 128*a* stacked in the stated order on the substrate 3. The peripheral gate dielectric layer 120 may include, e.g., silicon oxide, silicon nitride, or a high-K material. The high-K material may refer to a dielectric material having a higher dielectric constant than that of silicon oxide. The first conductive layer 125*a*, the second conductive layer 125*b*, and the third conductive layer 125*c* of the peripheral gate structure GS_P may include the same material as those of the first conductive layer 25*a*, the second conductive layer 25*b*, and the third conductive layer 25*c* of the bitline BL, respectively. The peripheral gate capping layer 128*a* may include the same material as that of the first capping layer 28*a* of the bitline capping layer 28.

The semiconductor device 100 may further include a peripheral gate spacer 129, a first peripheral capping layer 128*b*, a second peripheral capping layer 128*c*, and a lower interlayer insulating layer 130 in the peripheral circuit region PA. The peripheral gate spacer 129 may cover a side surface of the peripheral gate structure GS_P. For example, the peripheral gate spacers 129 may be spaced apart from each other with the peripheral gate structure GS_P interposed therebetween, and may cover side surfaces of the first conductive layer 125*a*, the second conductive layer 125*b*, the third conductive layer 125*c*, and the peripheral gate capping layer 128*a*.

The peripheral gate spacer 129 may include a first peripheral spacer 129*a*, a second peripheral spacer 129*b*, a third peripheral spacer 129*c*, and a mixture layer 129*d*. The first peripheral spacer 129*a* may cover a side surface of the peripheral gate structure GS_P. The second peripheral spacer 129*b* may cover a side surface of the first peripheral spacer 129*a*, and the third peripheral spacer 129*c* may cover a side surface of the second peripheral spacer 129*b*. The mixture layer 129*d* may be disposed on the second peripheral spacer 129*b*. For example, as illustrated in FIG. 5A, a portion of the first peripheral spacer 129*a* may extend in a horizontal direction along an upper surface of the substrate 3. In another example, lower surfaces of the first peripheral spacer 129*a*, the second peripheral spacer 129*b*, and the third peripheral spacer 129*c* may be coplanar with each other. The first peripheral spacer 129*a* and the third peripheral spacer 129*c* may include, e.g., silicon nitride, and the second peripheral spacer 129*b* may include, e.g., silicon oxide.

In an example embodiment, the mixture layer 129*d* may include silicon oxide and silicon nitride, and may be formed by nitriding a portion of the second peripheral spacer 129*b*. In the mixture layer 129*d*, silicon oxide and silicon nitride may not be spatially isolated and may be mixed with each other. The mixture layer 129*d* may include at least one of $SiO_2$, SiN and SiON. In an example embodiment, a ratio of silicon nitride to silicon oxide in the mixture layer 129*d* may vary depending on a depth from the upper surface of the mixture layer 129*d*, as illustrated in FIG. 5B.

The first peripheral capping layer 128*b* may cover the substrate 3, the peripheral gate spacer 129, and the peripheral gate structure GS_P, and may be conformally formed. The lower interlayer insulating layer 130 may partially cover the first peripheral capping layer 128*b*. An upper surface of the lower interlayer insulating layer 130 may be coplanar with an upper surface of the first peripheral capping layer 128*b*. The second peripheral capping layer 128*c* may cover the lower interlayer insulating layer 130 and the first peripheral capping layer 128*b*.

The first peripheral capping layer 128*b* and the second peripheral capping layer 128*c* may include the same material as those of the second capping layer 28*b* and the third capping layer 28*c* of the bitline capping layer 28, respectively, and may include, e.g., silicon nitride. The lower interlayer insulating layer 130 may include silicon oxide, silicon nitride, silicon oxynitride, or a combination thereof.

In the peripheral circuit region PA, the peripheral contact plug 170 may be disposed adjacent to the peripheral gate structure GS_P and may be electrically connected to the second active region 8. For example, the peripheral contact plug 170 may penetrate through the second peripheral capping layer 128*c*, the lower interlayer insulating layer 130, and the first peripheral capping layer 128*b*, and may be in contact with the second peripheral impurity region 11. The peripheral contact plug 170 may include the same material as that of the lower landing pad 70. For example, the peripheral contact plug 170 may include titanium nitride (TiN). In an example embodiment, the peripheral contact plug 170 may include a void V therein.

The semiconductor device 100 may further include a metal-semiconductor compound layer 166 disposed between the peripheral contact plug 170 and the second peripheral impurity region 11. The metal-semiconductor compound layer 166 may be formed by siliciding a portion of the second active region 8. The metal-semiconductor compound layer 166 may include, e.g., cobalt silicide (CoSi), titanium silicide (TiSi), nickel silicide (NiSi), tungsten silicide (WSi), or other metal silicide.

The peripheral interconnection layer 171 may be disposed on the peripheral contact plug 170 and may extend in a horizontal direction. The peripheral interconnection layer 171 may include a metal layer 171*a* and a metal nitride layer 171*b* on the metal layer 171*a*. The metal nitride layer 171*b* may cover the metal layer 171*a*. For example, the metal nitride layer 171*b* may extend (e.g., lengthwise) along a side surface and an upper surface of the peripheral interconnection layer 171 and may cover the side surface and the upper surface of the metal layer 171*a*. A lower surface of the metal nitride layer 171*b* may be coplanar with a lower surface of the metal layer 171*a*. The metal layer 171A may include, e.g., at least one of titanium (Ti), tantalum (Ta), tungsten (W), molybdenum (Mo), ruthenium (Ru), and aluminum (Al). For example, the metal layer 171*a* may include tungsten (W). The metal nitride layer 171*b* may include, e.g., at least one of titanium nitride (TiN), tantalum nitride (TaN), tungsten nitride (WN), molybdenum nitride (MoN), ruthenium nitride (RuN) and aluminum nitride (AlN).

The peripheral insulating structure IS may penetrate through the peripheral interconnection layer 171 and may extend (e.g., lengthwise) in a vertical direction. The peripheral insulating structure IS may spatially isolate the peripheral interconnection layers 171 from each other and electrically insulate the peripheral interconnection layers 171. In an example embodiment, the peripheral insulating structure IS may include a first peripheral insulating structure IS1, a second peripheral insulating structure IS2, and a third peripheral insulating structure IS3. The first peripheral insulating structure IS1 may be disposed adjacent to the peripheral contact plug 170 and may include a mixture layer ISa, a first peripheral insulating layer ISb, and a second peripheral insulating layer ISc. A lower end (e.g., lowermost end) of the first peripheral insulating structure IS1 may be disposed on a lower level than an upper surface (e.g., uppermost surface) of the peripheral gate structure GS_P, e.g., relative to a bottom of the substrate 3. In an example embodiment, a lower end of the first peripheral insulating structure IS1 may be disposed on a lower level than an upper end of void V of the peripheral contact plug 170. The mixture layer ISa may be formed by nitriding a portion of the lower interlayer insulating layer 130. The mixture layer ISa may extend along a lower surface and a side surface of the first peripheral insulating layer ISb. The first peripheral insulating layer ISb may be disposed on the mixture layer ISa, and an upper surface of the first peripheral insulating layer ISb may include a concave curved surface. The second peripheral insulating layer ISc may be disposed on the first peripheral insulating layer ISb and may penetrate through the peripheral interconnection layer 171 and the second peripheral capping layer 128*c*. An upper surface of the second peripheral insulating layer ISc may be coplanar with an upper surface of the peripheral interconnection layer 171.

In an example embodiment, the mixture layer ISa may include silicon oxide and silicon nitride, and in the mixture layer ISa, silicon oxide and silicon nitride may not be spatially isolated from each other and may be mixed with each other. The mixture layer ISa may include at least one of $SiO_2$, SiN and SiON. In an example embodiment, a ratio of silicon nitride to silicon oxide in the mixture layer ISa may vary depending on a depth from an upper surface of the mixture layer ISa, as illustrated in FIG. 5B. The first peripheral insulating layer ISb may include, e.g., at least one of $SiO_2$, SiN, SiON, SiBN, SiCN, ZnO, $HfO_2$. In an example embodiment, the first peripheral insulating layer ISb may include $SiO_2$ and may include hydrogen ions (H+).

In an example embodiment, the second peripheral insulating structure IS2 may extend in a vertical direction and may penetrate through the peripheral gate spacer 129. The second peripheral insulating structure IS2 may include a mixture layer ISa, a first peripheral insulating layer ISb, and a second peripheral insulating layer ISc stacked in order. The mixture layer ISa may be disposed between the first peripheral insulating layer ISb and the lower interlayer insulating layer 130. The first peripheral insulating layer ISb may penetrate through the peripheral gate spacer 129 and may be in contact with the mixture layer 129*d* of the peripheral gate spacer 129.

In an example embodiment, the third peripheral insulating structure IS3 may extend in a vertical direction and may partially penetrate through the peripheral gate capping layer 128*a*. The third peripheral insulating structure IS3 may not include a mixture layer ISa, and may include a first peripheral insulating layer ISb and a second peripheral insulating layer ISc.

Among the peripheral insulating structures IS in an example embodiment, the first peripheral insulating structure IS1 may have the largest horizontal width (e.g., in the X-direction) and the largest depth (e.g., in the Z direction). The horizontal width of the third peripheral insulating structure IS3 may be the smallest and the depth may also be the smallest.

An upper end of each of the first peripheral insulating layer ISb included in the first peripheral insulating structure IS1, the second peripheral insulating structure IS2, and the third peripheral insulating structure IS3 may be disposed on a lower level than the second peripheral capping layer 128*c*, e.g., relative to a bottom of the substrate 3. However, in example embodiments, an upper end of the first peripheral insulating layers ISb may be lower than a lower surface of the peripheral interconnection layer 171, and the first peripheral insulating layers ISb may be spaced apart (e.g., vertically) from the peripheral interconnection layer 171 and may not be in contact with the peripheral interconnection layer 171.

The semiconductor device 100 may further include the peripheral etch stop layer 175, an upper interlayer insulating layer 180, and a peripheral contact structure MC disposed on the peripheral interconnection layer 171 in the peripheral circuit region PA. The peripheral etch stop layer 175 may cover the peripheral insulating structure IS and the peripheral interconnection layer 171. The upper interlayer insulating layer 180 may cover the peripheral etch stop layer 175. The peripheral contact structure MC may penetrate through the upper interlayer insulating layer 180 and the peripheral etch stop layer 175, and may be electrically connected to at least one of the peripheral interconnection layers 171.

As illustrated in FIGS. 3B and 5, the peripheral insulating structure IS according to example embodiments may include the mixture layer ISa and the first peripheral insulating layer ISb, such that the peripheral insulating structure IS may protect the lower interlayer insulating layer 130 in the process of etching the upper landing pad 71. Accordingly, the lower interlayer insulating layer 130 may be prevented from being excessively etched, and defects of the semiconductor device 100 may be prevented or substantially reduced.

Figure 6:
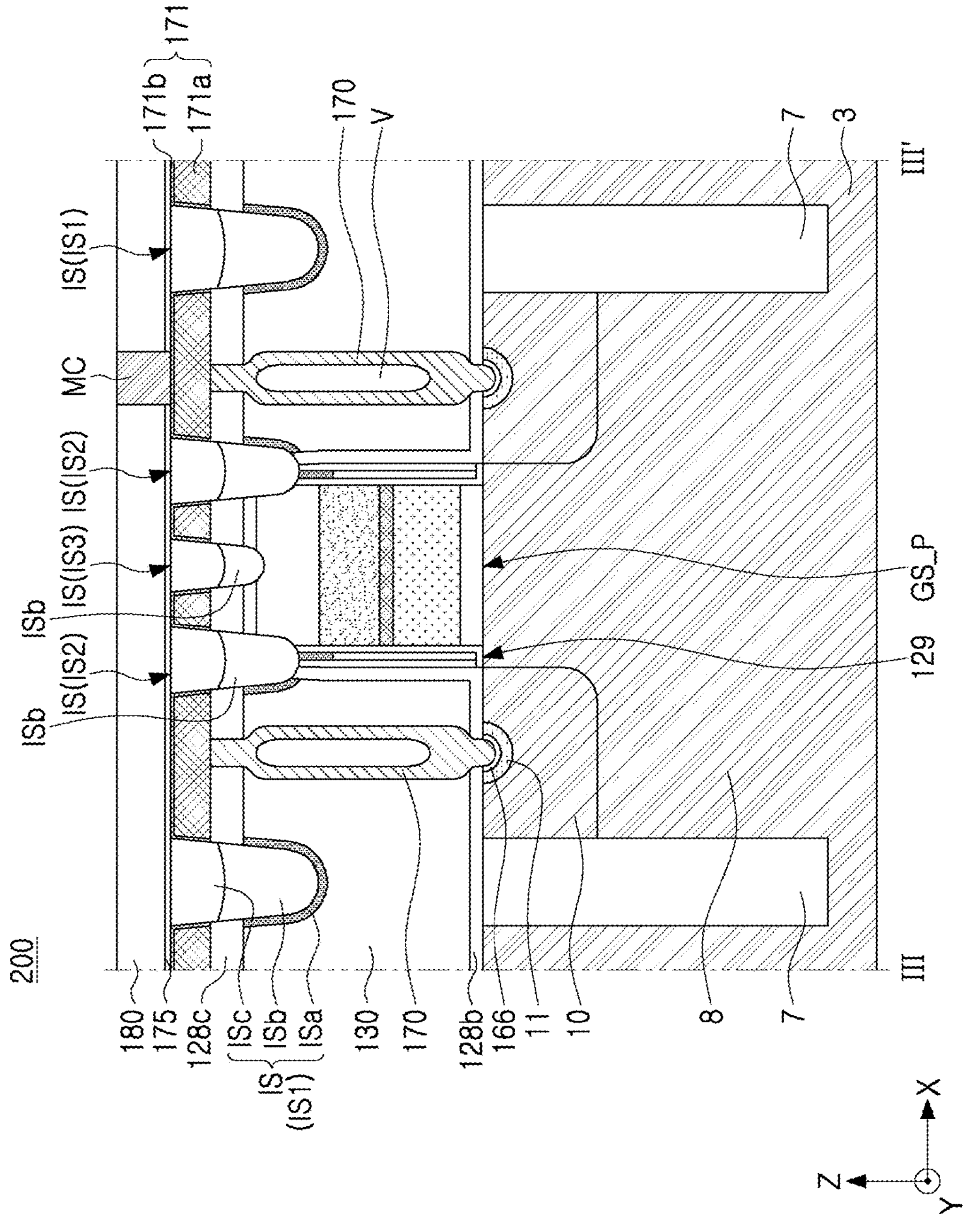
FIGS. 6 to 8 are cross-sectional view of a semiconductor device according to an example embodiment.
Figure 7:
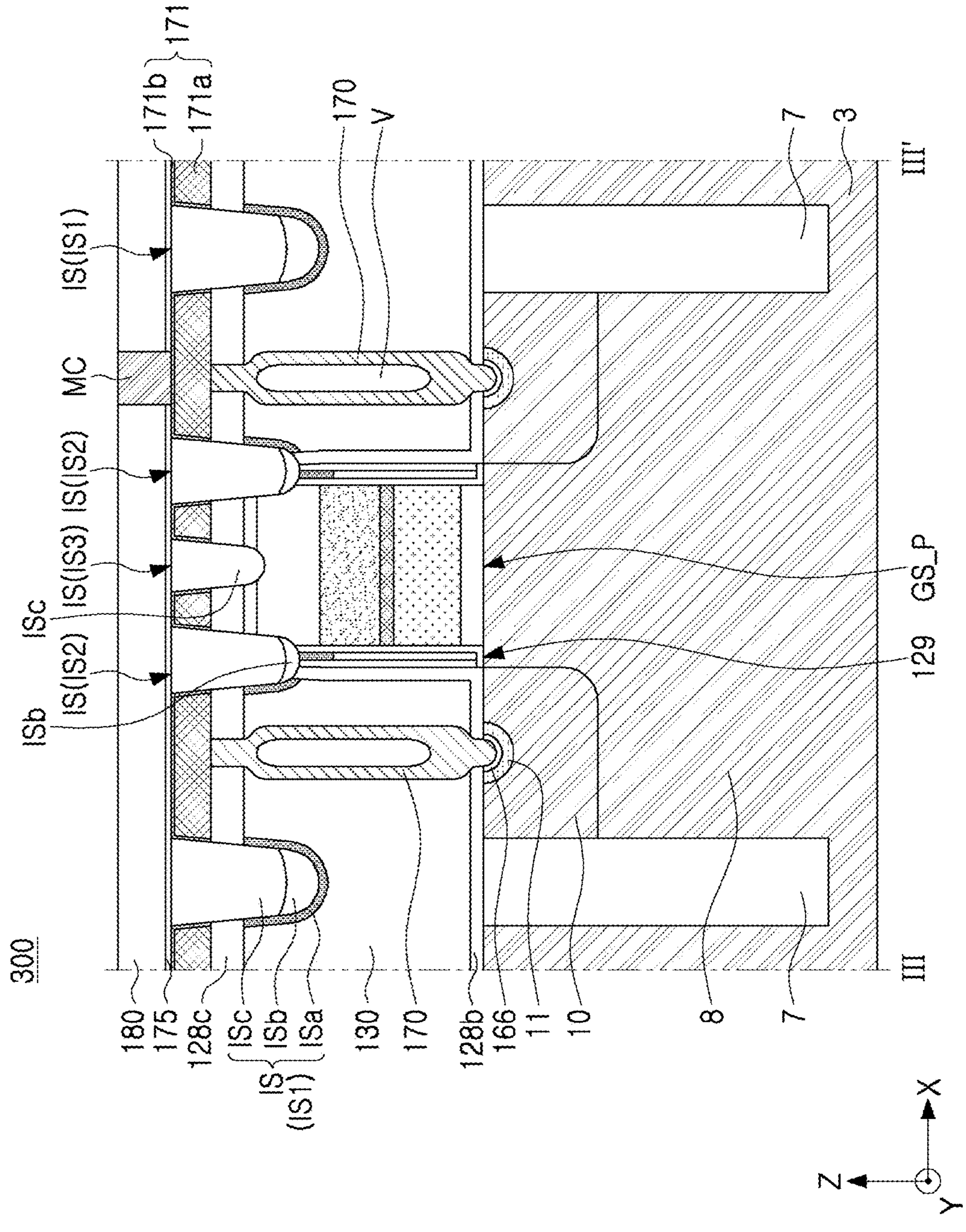
Figure 8:
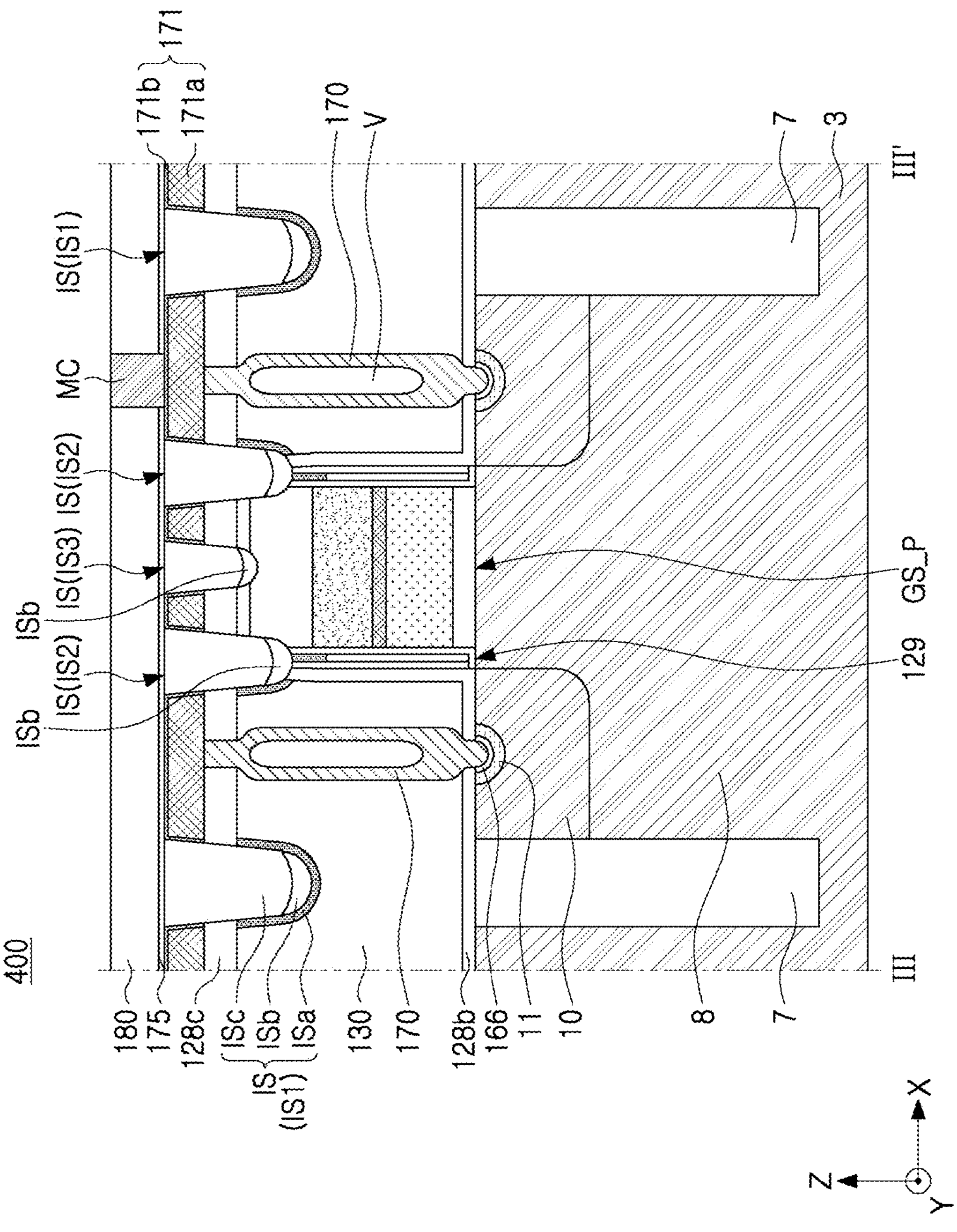

FIGS. 6 to 8 are cross-sectional diagrams illustrating a semiconductor device according to an example embodiment. FIGS. 6 to 8 correspond to the cross-section along line III-III' of FIG. 1.

Referring to FIG. 6, a semiconductor device 200 may include the first peripheral insulating structure IS1, the second peripheral insulating structure IS2, and the third peripheral insulating structure IS3 penetrating through the peripheral interconnection layer 171. In an example embodiment, an upper end of the first peripheral insulating layer ISb included in each of the first peripheral insulating structure IS1, the second peripheral insulating structure IS2, and the third peripheral insulating structure IS3 may be disposed on a higher level than an upper surface of the lower interlayer insulating layer 130, and may be disposed on a lower level than a lower surface of the peripheral interconnection layer 171. The first peripheral insulating layers ISb may be partially in contact with the second peripheral capping layer 128*c*.

Referring to FIG. 7, a semiconductor device 300 may include the first peripheral insulating structure IS1, the second peripheral insulating structure IS2, and the third peripheral insulating structure IS3 penetrating through the peripheral interconnection layer 171. In an example embodiment, an upper end of the first peripheral insulating layer ISb included in each of the first peripheral insulating structure IS1 and the second peripheral insulating structure IS2 may be disposed on a lower level than an upper surface of the lower interlayer insulating layer 130. The second peripheral insulating layer ISc included in each of the first peripheral insulating structure IS1 and the second peripheral insulating structure IS2 may be partially in contact with the mixture layer ISa. In an example embodiment, the third peripheral insulating structure IS3 may include a single-layer second peripheral insulating layer ISc (e.g., without the first peripheral insulating layer ISb). The second peripheral insulating layer ISc in the third peripheral insulating structure IS3 may extend in a vertical direction from an upper surface of the peripheral interconnection layer 171 and may be in contact with the peripheral gate structure GS_P. The peripheral insulating layer ISc may include the same material as that of the second peripheral insulating layer IS2.

Referring to FIG. 8, a semiconductor device 400 may include the first peripheral insulating structure IS1, the second peripheral insulating structure IS2, and the third peripheral insulating structure IS3 penetrating through the peripheral interconnection layer 171. In an example embodiment, an upper end of the first peripheral insulating layer ISb included in first peripheral insulating structure IS1 may be disposed on a lower level than an upper end of a first peripheral insulating layer ISb included in the second peripheral insulating structure IS2 and the third peripheral insulating structure IS3, e.g., relative to a bottom of the substrate 3. An upper end of the first peripheral insulating layer ISb included in the third peripheral insulating structure IS3 may be disposed on a higher level than an upper end of the first peripheral insulating layer ISb included in the first peripheral insulating structure IS1 and the second peripheral insulating structure IS2. In an etching process described below with reference to FIGS. 18A and 18B, since an etchant may further flow into the first opening OP1 having a relatively large horizontal width, the first peripheral insulating layer ISb may be further etched. Accordingly, as illustrated in FIG. 8, an upper end of a first peripheral insulating layer ISb included in the first peripheral insulating structure IS1 may be disposed on a lower level than an upper end of another first peripheral insulating layer ISb.

Figure 9A:
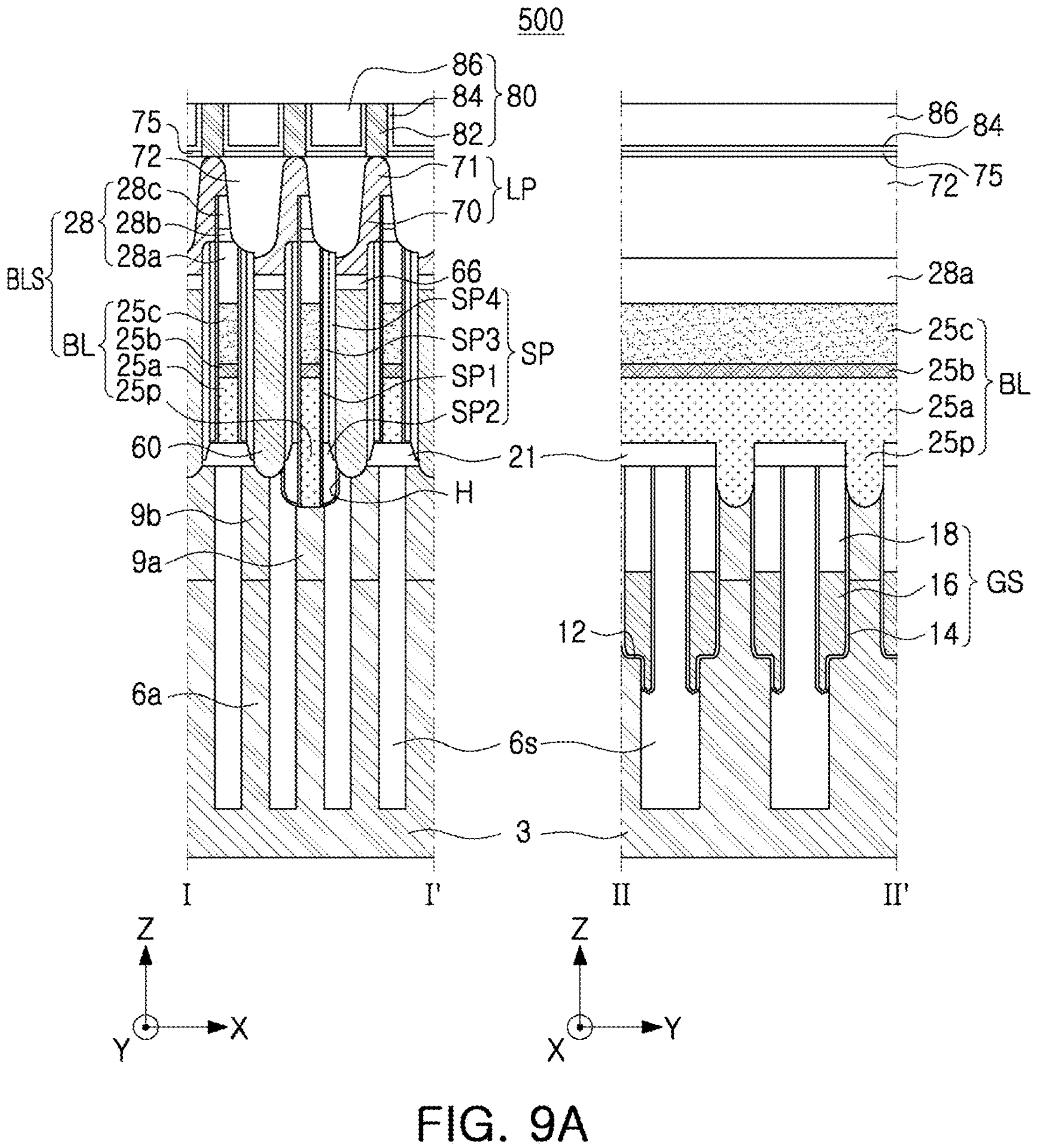
FIGS. 9A and 9B are cross-sectional views illustrating a semiconductor device according to an example embodiment.
Figure 9B:
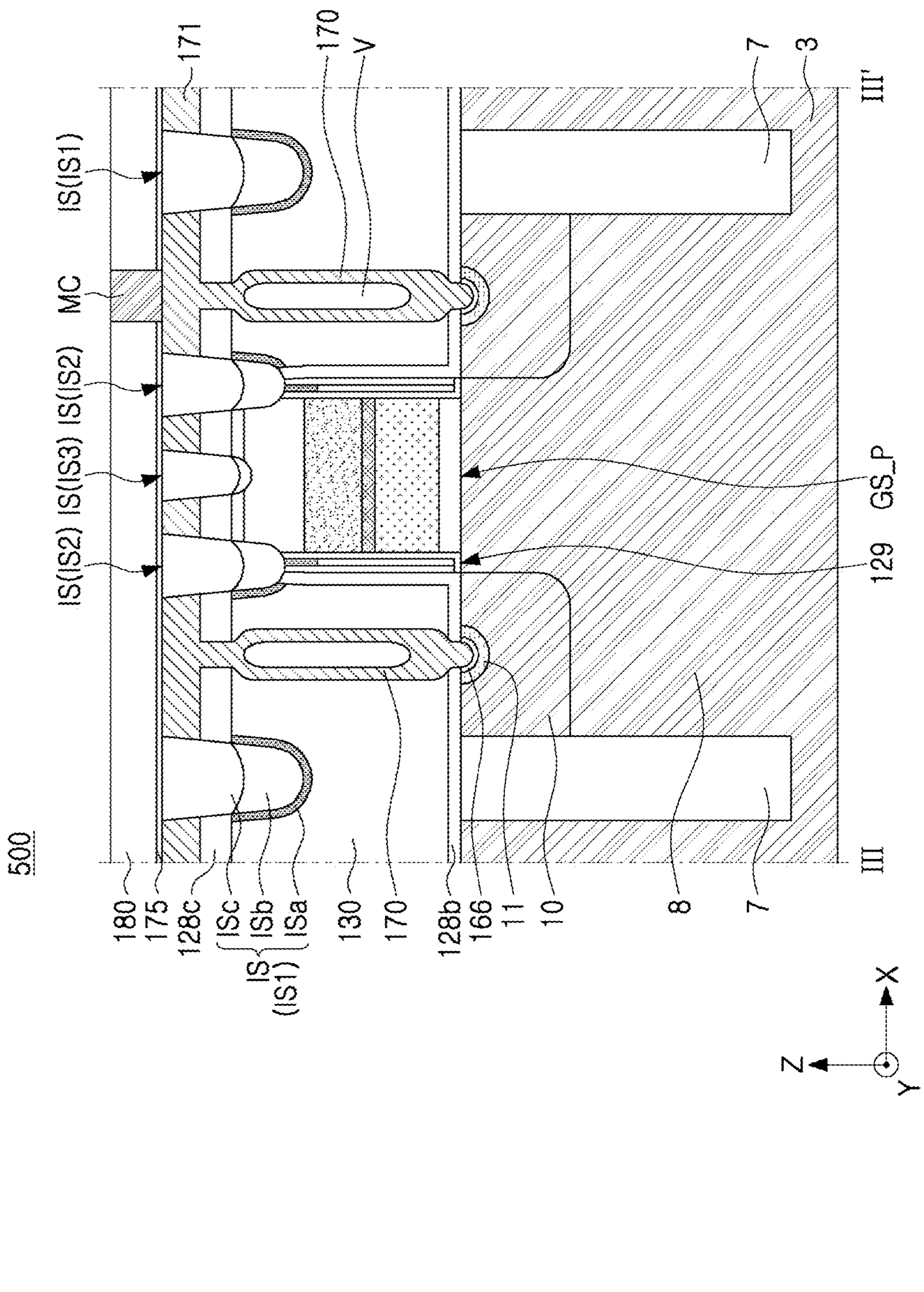

FIGS. 9A and 9B are cross-sectional diagrams illustrating a semiconductor device according to an example embodiment.

Referring to FIGS. 9A and 9B, a semiconductor device 500 may include the landing pad structure LP disposed on the contact plug 60 in the cell region CA. The landing pad structure LP may include the lower landing pad 70 and the upper landing pad 71. In an example embodiment, the lower landing pad 70 and the upper landing pad 71 may include the same material and may be integrally formed, e.g., integral with each other as a single unit. A portion of the landing pad structure LP disposed below the bitline structure BLS may be referred to as a lower landing pad 70, and a portion of the landing pad structure LP disposed above the bitline structure BLS may be referred to as an upper landing pad 71. Since the lower landing pad 70 and the upper landing pad 71 include the same material, the lower landing pad 70 and the upper landing pad 71 may be etched simultaneously in an etching process described below with reference to FIG. 19A. Accordingly, a side surface of the lower landing pad 70 and the side surface of the upper landing pad 71 may be coplanar with each other, and a step difference may not occur between the side surfaces of the cell insulating pattern 72. Also, since the upper landing pad 71 is also etched in the etching process in FIG. 19A, a portion of the upper surface and a portion of the side surface of the upper landing pad 71 may include a curved surface. In an example embodiment, the lower landing pad 70 and the upper landing pad 71 may include titanium nitride (TiN).

In the peripheral circuit region PA, the semiconductor device 100 may include the peripheral contact plug 170 penetrating through the lower interlayer insulating layer 130 and the peripheral interconnection layer 171 on the peripheral contact plug 170. In an example embodiment, the peripheral contact plug 170 may include the same material as that of the peripheral interconnection layer 171 and may be integrally formed. In an example embodiment, the peripheral contact plug 170 and the peripheral interconnection layer 171 may include titanium nitride (TiN).

FIGS. 10A to 20B are cross-sectional diagrams illustrating stages in a method of manufacturing a semiconductor device according to an example embodiment. Specifically, FIGS. 10A, 11A, 12A, 13A, 14A, 15A, 16A, 17A, 18A, 19A and 20A are vertical cross-sectional diagrams illustrating the cell region CA and corresponding to FIG. 3A. FIGS. 10B, 11B, 12B, 13B, 14B, 15B, 16B, 17B, 18B, 19B and 20B are vertical cross-sectional diagrams illustrating the peripheral circuit region PA and corresponding to FIG. 3B.

Figure 10A:
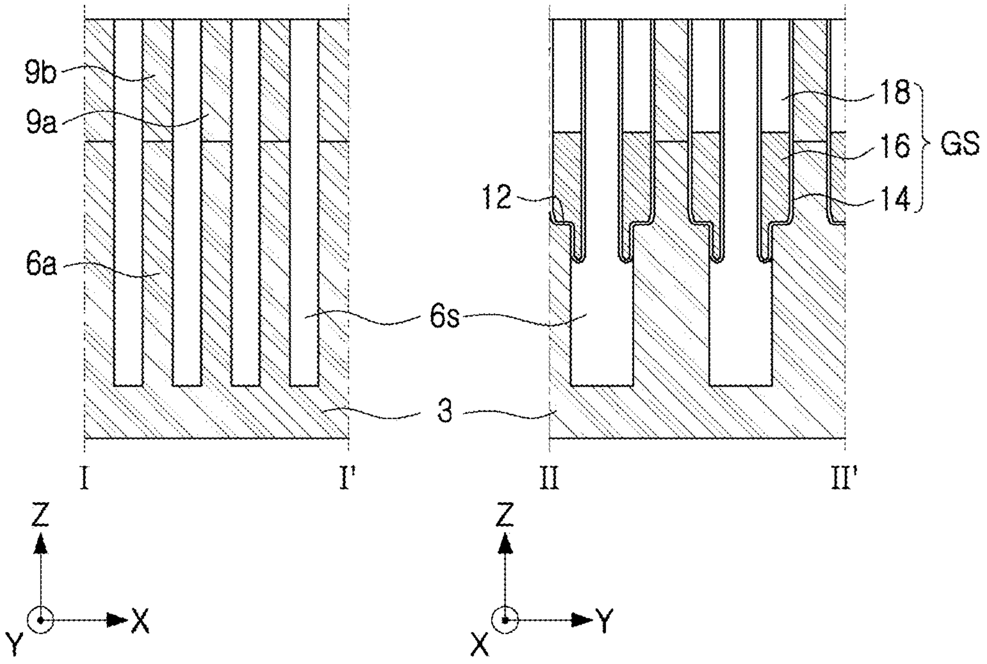
FIGS. 10A to 20B are cross-sectional views of stages in a method of manufacturing a semiconductor device according to an example embodiment.
Figure 10B:
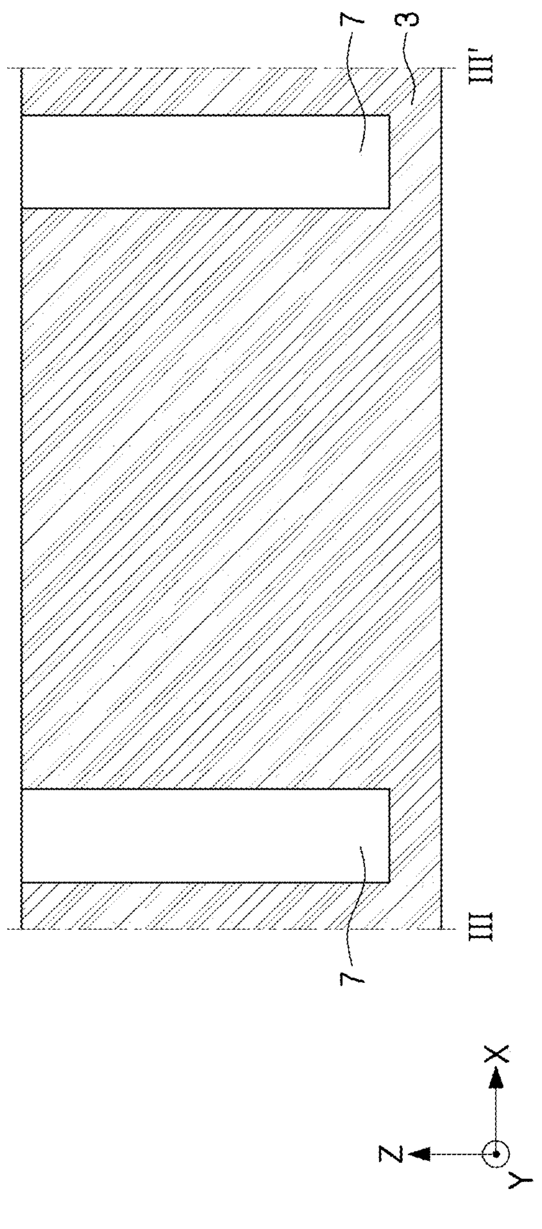

Referring to FIGS. 10A and 10B, the first device isolation layer 6*s* and the cell gate structure GS may be formed in the substrate 3 in the cell region CA. The first device isolation layer 6*s* may be formed by performing a planarization process of forming a trench on the upper surface of the substrate 3, filling the trench with an insulating material, and etching the substrate 3 and the insulating material. The first device isolation layer 6*s* may define first active regions 6*a*. For example, the first active regions 6*a* may correspond to a portion of an upper surface of the substrate 3 surrounded by the first device isolation layer 6*s*. In a plan diagram, the first active regions 6*a* may have a bar shape having a minor axis and a major axis, and may be spaced apart from each other. The first device isolation layer 6*s* may be configured as a single layer or a plurality of layers.

In an example embodiment, the first impurity region 9*a* and the second impurity region 9*b* may be formed by implanting impurities into the substrate 3 before the first device isolation layer 6*s* is formed. However, in example embodiments, the first impurity region 9*a* and the second impurity region 9*b* may be formed after forming the first device isolation layer 6*s* or in another process.

Thereafter, gate trenches 12 may be formed by anisotropically etching the substrate 3. The gate trenches 12 may extend in the X-direction and may intersect the first active region 6*a* and the first device isolation layer 6*s*. The cell gate structure GS may be formed by forming the cell gate dielectric layer 14, the gate electrode 16, and the gate capping layer 18 in the gate trench 12. The cell gate dielectric layer 14 may be conformally formed on an internal wall of the gate trench 12. The gate electrode 16 may be formed by forming a conductive material on the cell gate dielectric layer 14 and recessing the conductive material. The gate capping layer 18 may be formed by forming an insulating material on the gate electrode 16 to fill the gate trench 12 and performing a planarization process. In an example embodiment, as illustrated in FIG. 10A, the gate trench 12 may be formed to have a greater depth in the first device isolation layer 6*s* than in the first active region 6*a*.

In the peripheral circuit region PA, the second device isolation layer 7 may be formed in the substrate 3. In an example embodiment, the second device isolation layer 7 may be formed simultaneously with the first device isolation layer 6*s*. The second device isolation layer 7 may define the second active region 8. For example, the second active region 8 may correspond to a portion of the upper surface of the substrate 3 surrounded by the second device isolation layer 7.

Figure 11A:
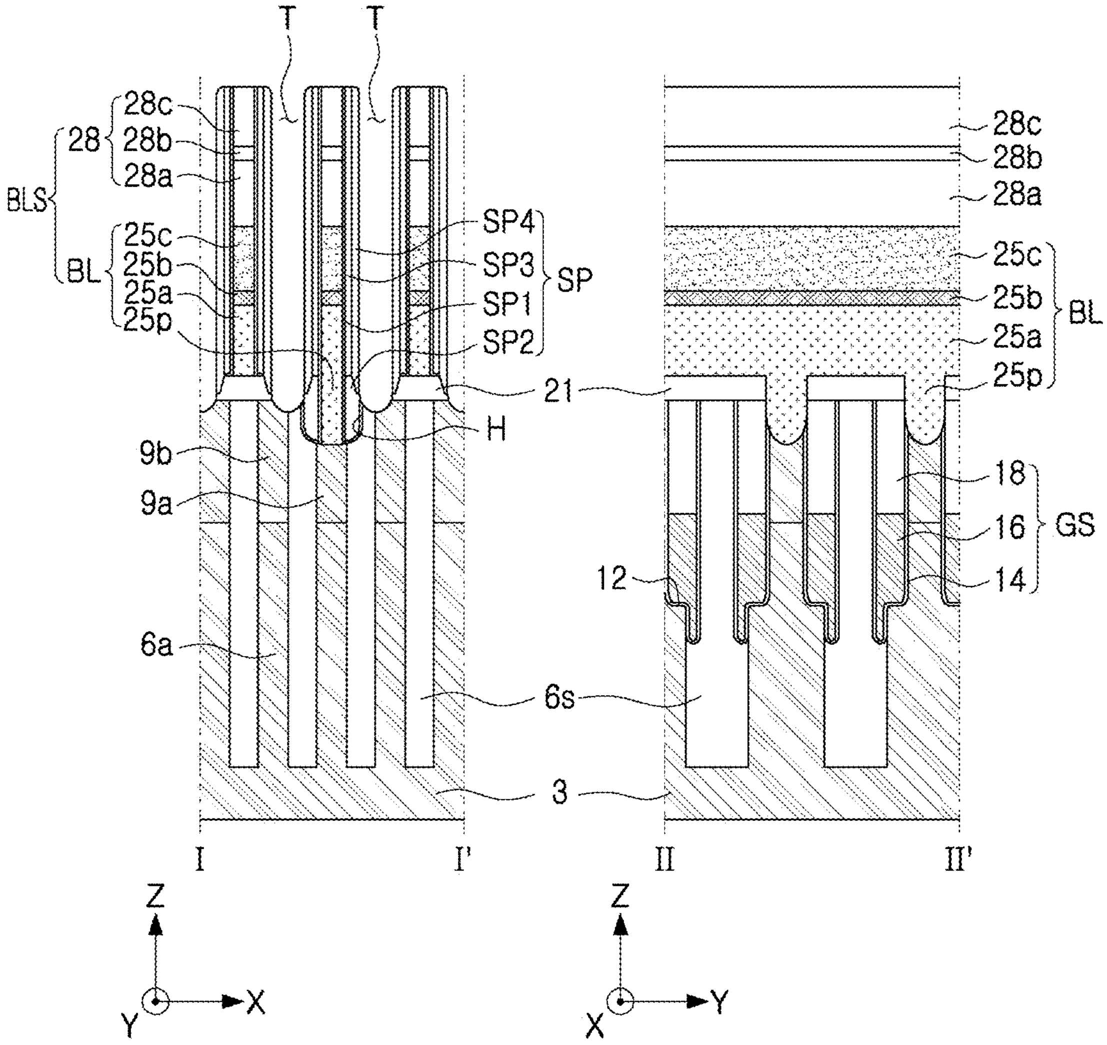
Figure 11B:
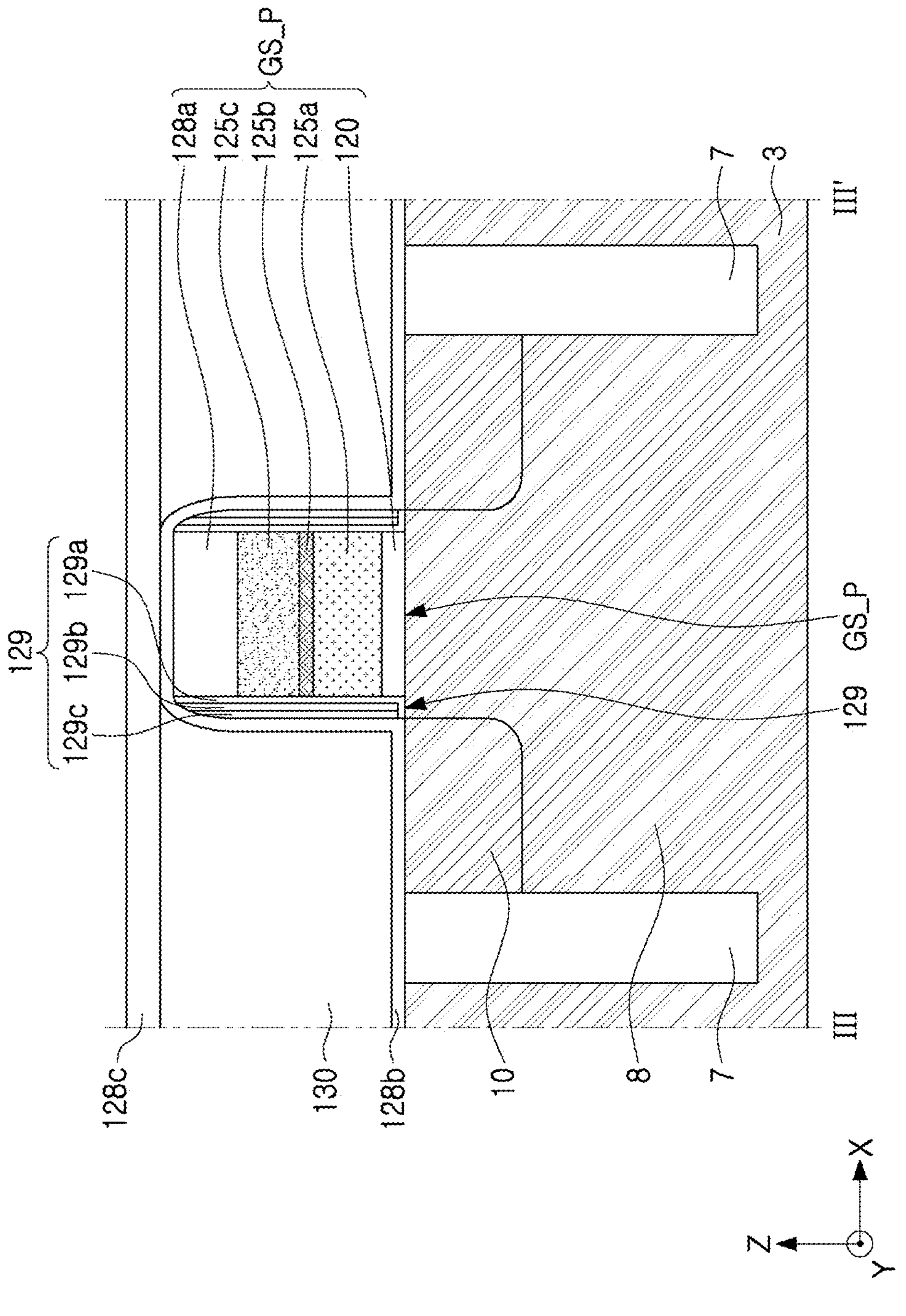

Referring to FIGS. 11A and 11B, the buffer layer 21, the bitline structure BLS, and the spacer structure SP may be formed on the substrate 3 in the cell region CA. The buffer layer 21 may be formed on the upper surfaces of the substrate 3, the first active region 6*a*, the first device isolation layer 6*s*, and the cell gate structure GS. The buffer layer 21 may be configured as a single layer or a plurality of layers.

The bitline structure BLS may be formed on the buffer layer 21. The bitline structure BLS may be formed by forming the contact hole H by etching the buffer layer 21 to expose the first active region 6*a*, stacking conductive material layers on the contact hole H, forming insulating material layers on the conductive material layers, and patterning the conductive material layers and the insulating material layers. For example, the conductive material layers and the insulating material layers may be patterned to form trenches extending in the Y-direction and spaced apart from each other in the X-direction. The upper surface of the first active region 6*a* may be partially exposed by the patterning process. The bitline structures BLS may extend in the Y-direction and may be spaced apart from each other in the X-direction.

The bitline structure BLS may include the bitline BL including a conductive material and the bitline capping layer 28 including an insulating material. The bitline BL may include the first conductive layer 25*a*, the second conductive layer 25*b*, and the third conductive layer 25*c* stacked in order, and the first conductive layer 25*a* may include the plug portion 25*p* disposed in the contact hole H. The bitline capping layer 28 may include the first capping layer 28*a*, the second capping layer 28*b*, and the third capping layer 28*c* stacked in order.

The spacer structure SP may be formed on both side surfaces of the bitline structure BLS. The spacer structure SP may include the first spacer SP1, the second spacer SP2, the third spacer SP3, and the fourth spacer SP4. The first spacer SP1 may be formed by conformally depositing an insulating material along a side surface of the bitline structure BLS and an internal wall of the contact hole H. The second spacer SP2 may be formed by depositing an insulating material on the first spacer SP1 to fill the contact hole H. The third spacer SP3 and the fourth spacer SP4 may be formed by forming an insulating material to cover side surfaces of the second spacer SP2 and the third spacer SP3 and etching the insulating material. The spacer structure SP may extend in the Y-direction along a side surface of the bitline structure BLS.

After the spacer structure SP is formed, a process of etching the buffer layer 21 may be performed to expose an upper surface of the first active region 6*a*. The space between the bitline structures BLS may be referred to as a trench. For example, the trench may be defined by side surfaces of adjacent spacer structures SP opposing each other and may extend in the Y-direction.

The peripheral gate structure GS_P, the first peripheral capping layer 128*b*, the second peripheral capping layer 128*c*, the peripheral gate spacer 129, and the lower interlayer insulating layer 130 may be formed on the substrate 3 in the peripheral circuit region PA.

The peripheral gate structure GS_P may include the peripheral gate dielectric layer 120, the first conductive layer 125*a*, the second conductive layer 125*b*, the third conductive layer 125*c*, and the peripheral gate capping layer 128*a* stacked in order. The peripheral gate structure GS_P may be formed by forming a dielectric material on the substrate 3, stacking a conductive material and an insulating material on the dielectric material, and patterning the dielectric material, a conductive material, and an insulating material. In an example embodiment, the first conductive layer 125*a*, the second conductive layer 125*b* and the third conductive layer 125*c* of the peripheral gate structure GS_P may be formed in the same process as the process of forming the first conductive layer 25*a*, the second conductive layer 25*b* and the third conductive layer 25*c* of the bitline BL. The first conductive layer 125*a*, the second conductive layer 125*b*, and the third conductive layer 125*c* of the peripheral gate structure GS_P may include the same material as those of first conductive layer 25*a*, the second conductive layer 25*b*, and the third conductive layer 25*c* of the bitline BL, respectively. In an example embodiment, the peripheral gate capping layer 128*a* of the peripheral gate structure GS_P may be formed in the same process as the process of forming the first capping layer 28*a* of the bitline capping layer 28.

After the peripheral gate structure GS_P is formed, the peripheral gate spacer 129 covering a side surface of the peripheral gate structure GS_P may be formed. The peripheral gate spacer 129 may be formed by forming an insulating material to cover the peripheral gate structure GS_P and anisotropically etching the insulating material. The peripheral gate spacer 129 may be composed of a single layer or a plurality of layers. In an example embodiment, the peripheral gate spacer 129 may include the first peripheral spacer 129*a*, the second peripheral spacer 129*b*, and the third peripheral spacer 129*c*. The first peripheral spacer 129*a*, the second peripheral spacer 129*b*, and the third peripheral spacer 129*c* may be formed by conformally stacking insulating materials in order along the substrate 3 and the peripheral gate structure GS_P, and etching the insulating materials.

After the peripheral gate structure GS_P is formed, the first peripheral impurity region 10 may be formed in the substrate 3 using the peripheral gate structure GS_P as an ion implantation mask.

The first peripheral capping layer 128*b* may be conformally formed along surfaces of the substrate 3, the second device isolation layer 7, the peripheral gate structure GS_P, and the peripheral gate spacer 129. The lower interlayer insulating layer 130 may be formed by forming an insulating material to cover the first peripheral capping layer 128*b* and performing a planarization process to expose an upper surface of the first peripheral capping layer 128*b*. The second peripheral capping layer 128*c* may be formed to cover upper surfaces of the first peripheral capping layer 128*b* and the lower interlayer insulating layer 130. In an example embodiment, the first peripheral capping layer 128*b* and the second peripheral capping layer 128*c* may be formed simultaneously with the second capping layer 28*b* and the third capping layer 28*c* of the bitline capping layer 28, respectively.

Figure 12A:
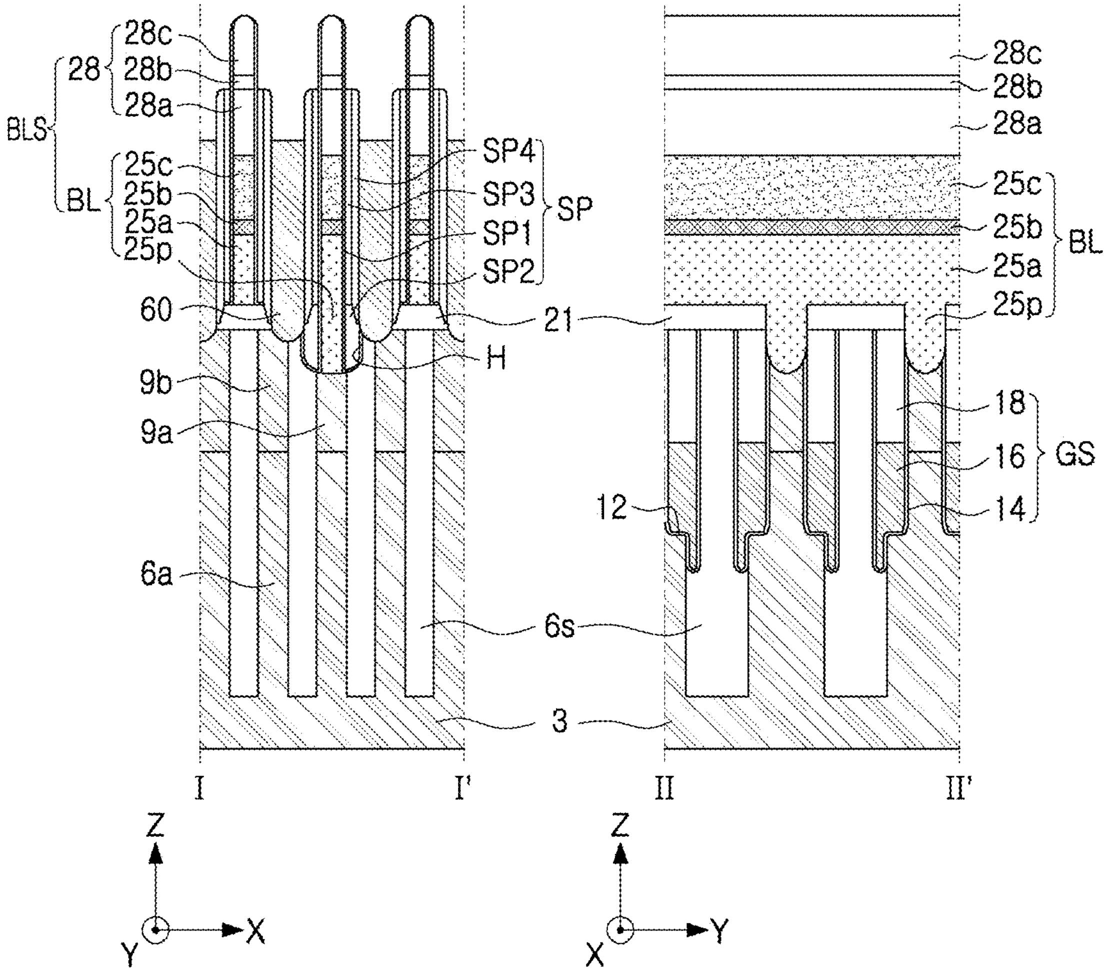
Figure 12B:
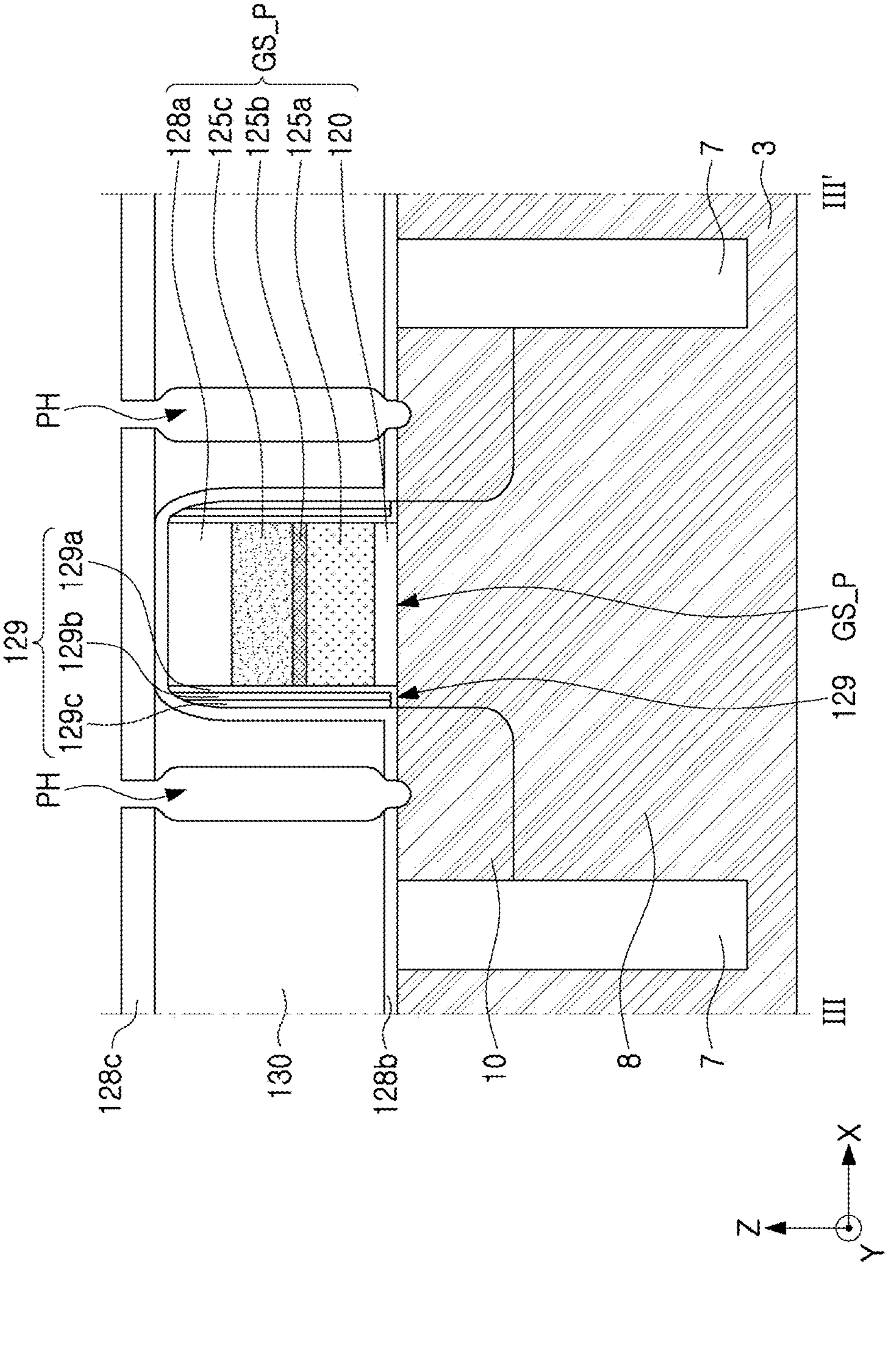

Referring to FIGS. 12A and 12B, the contact plug 60 may be formed in the trench T in the cell region CA. The contact plug 60 may be formed by filling the trench T with a conductive material to cover the spacer structure SP and etching back the conductive material. An upper surface of the contact plug 60 may be disposed on a lower level than an upper end of the bitline structure BLS. The contact plug 60 may be in contact with an upper surface of the first active region 6*a* and may partially fill a space between the spacer structures SP. Thereafter, a portion of the spacer structure SP may be etched by an etching process. For example, upper portions of the first spacer SP1, the third spacer SP3, and the fourth spacer SP4 may be partially removed. The contact plug 60 may be electrically connected to the first active region 6*a*, e.g., the second impurity region 9*b*.

In an example embodiment, after the contact plug 60 is formed, the fence structure 63 illustrated in FIG. 2 may be formed. The fence structure 63 may be formed by removing a portion of the contact plug 60 and filling the space from which the portion of the contact plug 60 is removed with an insulating material. The fence structures 63 may be formed to overlap the cell gate structure GS between the bitline structures BLS in the vertical direction. The fence structures 63 may be spaced apart from each other in the X-direction and the Y-direction. For example, the contact plugs 60 may be alternately disposed with the fence structures 63 in the Y-direction between the bitline structures BLS. In some example embodiments, the process of forming the fence structure 63 may be performed prior to the process of forming the contact plug 60.

A peripheral contact hole PH may be formed by anisotropically etching the second peripheral capping layer 128*c*, the lower interlayer insulating layer 130, and the second peripheral capping layer 128*c* in the peripheral circuit region PA. The peripheral contact hole PH may be formed adjacent to the peripheral gate structure GS_P and may expose an upper surface of the first peripheral impurity region 10. Since the lower interlayer insulating layer 130 may include a material different from those of the first peripheral capping layer 128*b* and the second peripheral capping layer 128*c*, the lower interlayer insulating layer 130 may have an etching selectivity with the first peripheral capping layer 128*b* and the second peripheral capping layer 128*c*. In an example embodiment, the lower interlayer insulating layer 130 may be further etched than the first peripheral capping layer 128*b* and the second peripheral capping layer 128*c* by the etching process, and the peripheral contact hole PH may have a relatively horizontal width in the lower interlayer insulating layer 130.

Figure 13A:
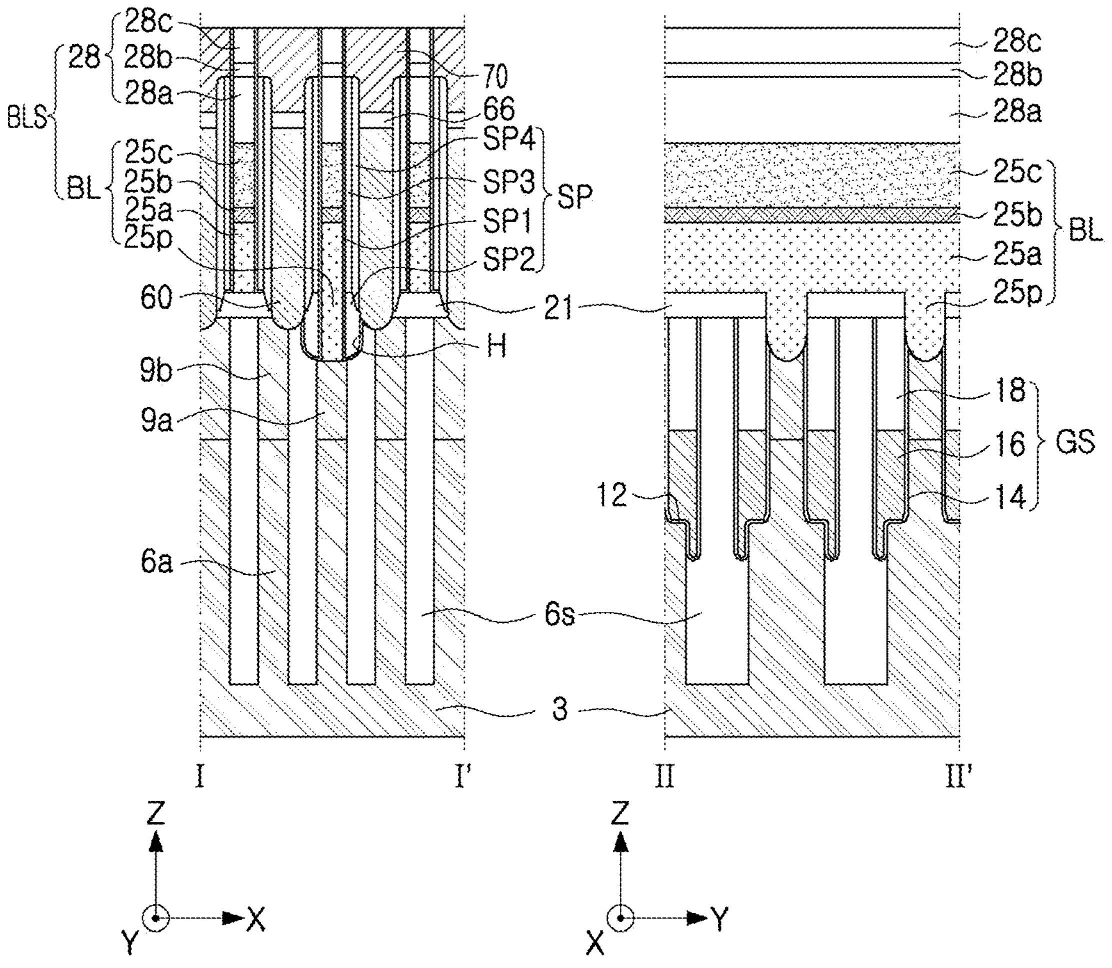
Figure 13B:
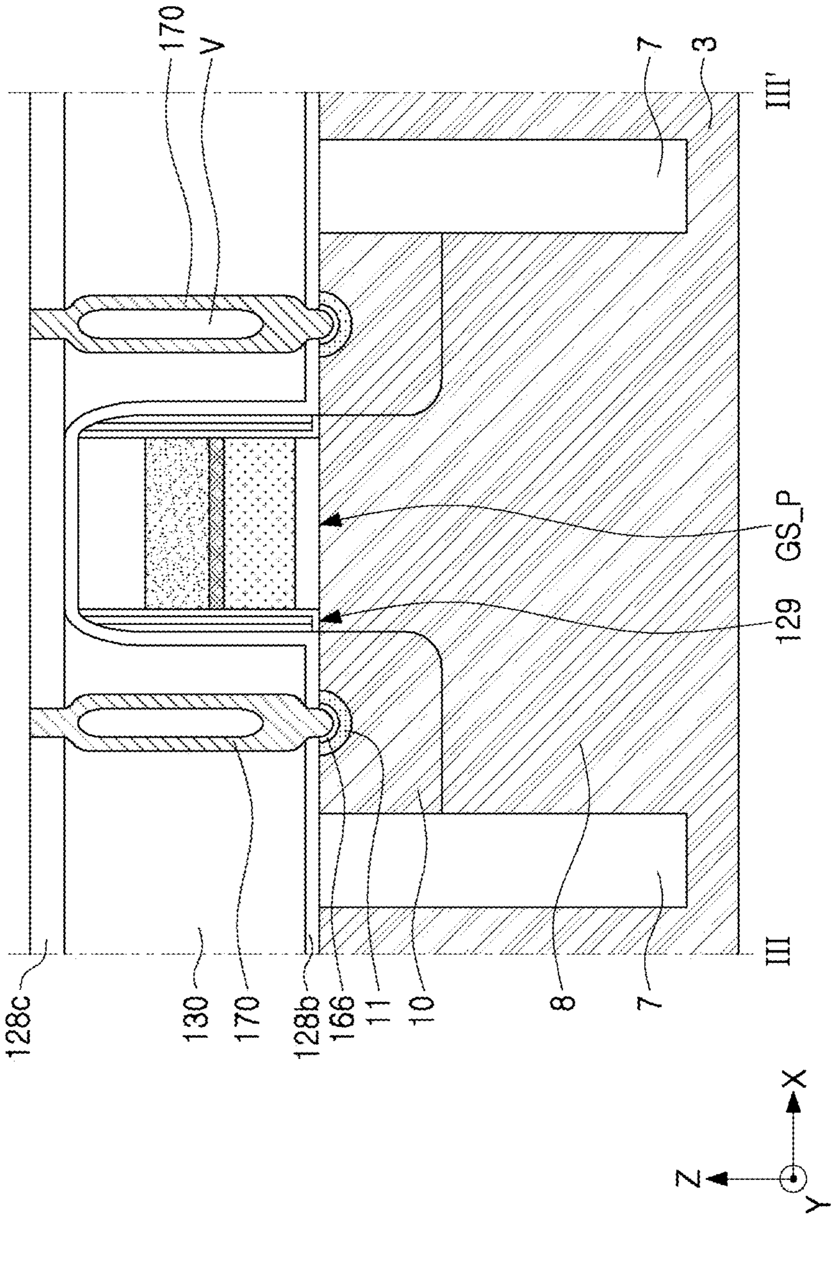

Referring to FIGS. 13A and 13B, the lower landing pad 70 may be formed in the cell region CA. The lower landing pad 70 may be formed by forming a metal material to cover the bitline structure BLS and the spacer structure SP and planarizing the metal material. In an example embodiment, the metal material may be formed by a deposition process, e.g., a chemical vaporization deposition (CVD) method, a physical vapor deposition (PVD) method, and an atomic layer deposition (ALD) deposition method.

In an example embodiment, the metal-semiconductor compound layer 66 may be formed between the contact plug 60 and the lower landing pad 70. The metal-semiconductor compound layer 66 may be formed by silicidizing a portion of the contact plug 60.

In the peripheral circuit region PA, the second peripheral impurity region 11, the metal-semiconductor compound layer 166, and the peripheral contact plug 170 may be formed. The second peripheral impurity region 11 may be formed using an ion implantation process on an upper surface of the second active region 8 exposed by the peripheral contact hole PH. The metal-semiconductor compound layer 166 may be formed by siliciding a portion of the second active region 8. The peripheral contact plug 170 may be formed by forming a metal material to fill the peripheral contact hole PH on the metal-semiconductor compound layer 166 and planarizing the metal material. For example, the void V may be formed in the peripheral contact plug 170. In another examples, the peripheral contact plug 170 may not include the void V. The peripheral contact plug 170 may be electrically connected to the impurity region. In an example embodiment, the peripheral contact plug 170 may be formed simultaneously with the lower landing pad 70. For example, the peripheral contact plug 170 may include the same material as that of the lower landing pad 70.

Figure 14A:
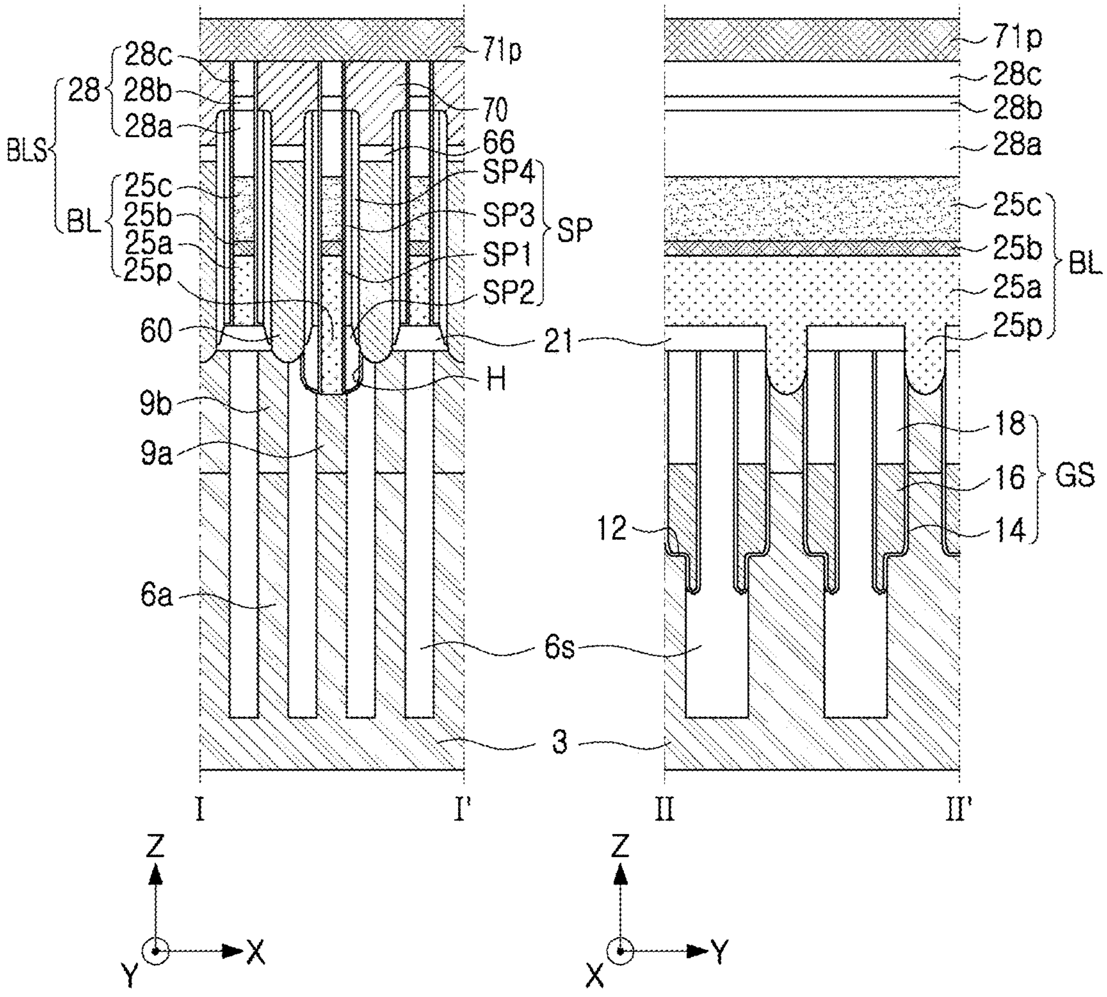
Figure 14B:
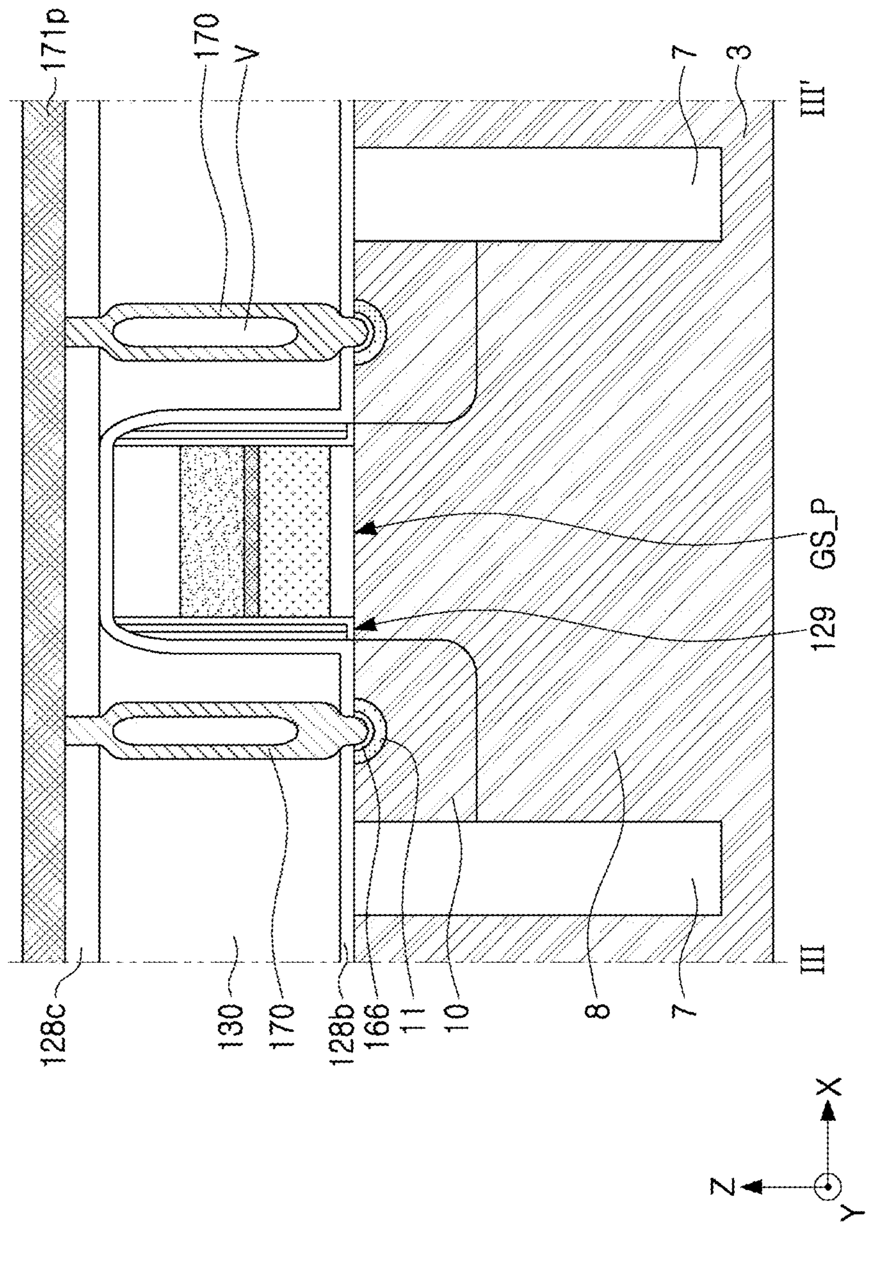

Referring to FIGS. 14A and 14B, a preliminary upper landing pad 71*p* may be formed on the lower landing pad 70 in the cell region CA. The preliminary upper landing pad 71*p* may cover upper surfaces of the bitline structure BLS, the spacer structure SP, and the lower landing pad 70. In an example embodiment, the preliminary upper landing pad 71*p* may include a material different from that of the lower landing pad 70. For example, the lower landing pad 70 may include titanium nitride, and the preliminary upper landing pad 71*p* may include tungsten.

A preliminary peripheral interconnection layer 171*p* may be formed on the peripheral contact plug 170 in the peripheral circuit region PA. The preliminary peripheral interconnection layer 171*p* may cover upper surfaces of the second peripheral capping layer 128*c* and the peripheral contact plug 170. In an example embodiment, the preliminary peripheral interconnection layer 171*p* may be formed simultaneously with the preliminary upper landing pad 71*p*. For example, the preliminary peripheral interconnection layer 171*p* may include the same material as that of the preliminary upper landing pad 71*p*.

Figure 15A:
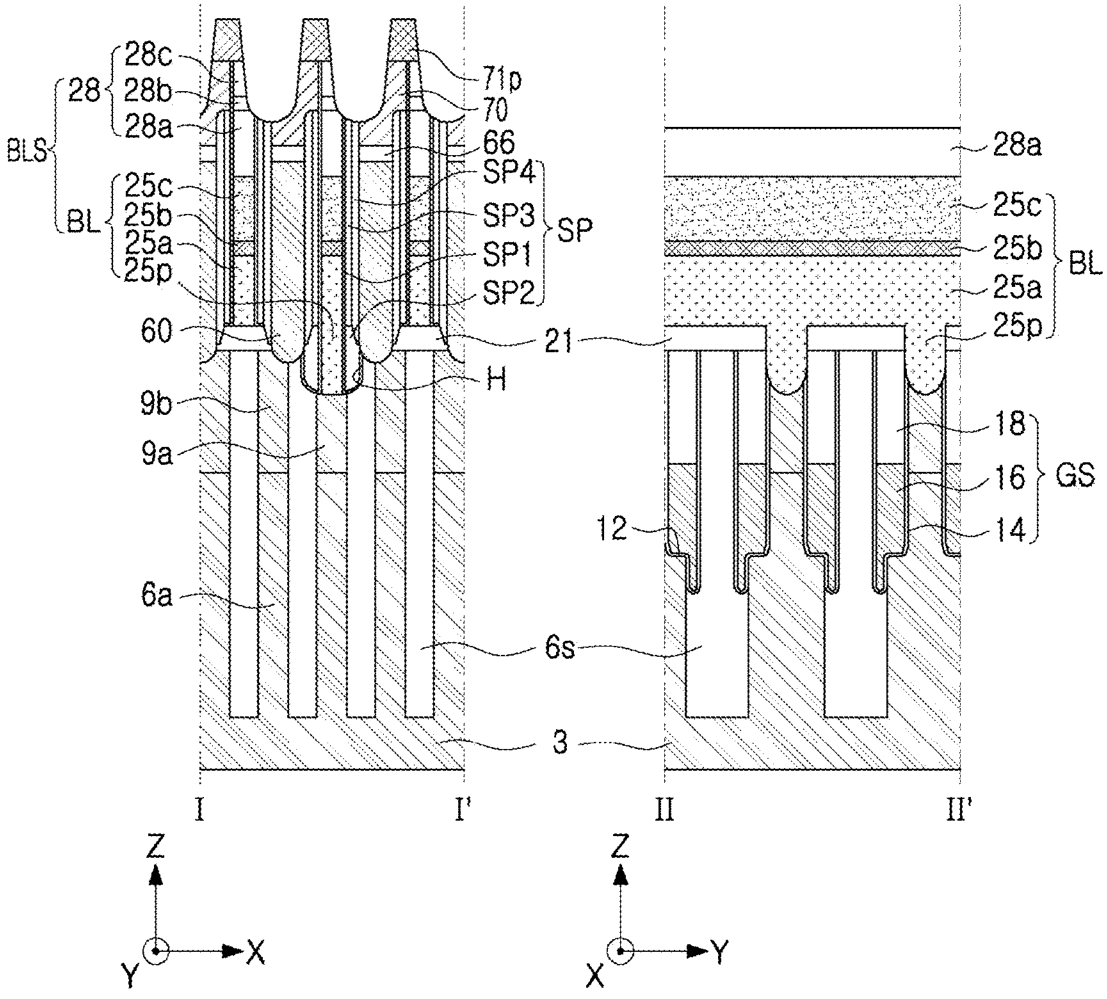
Figure 15B:
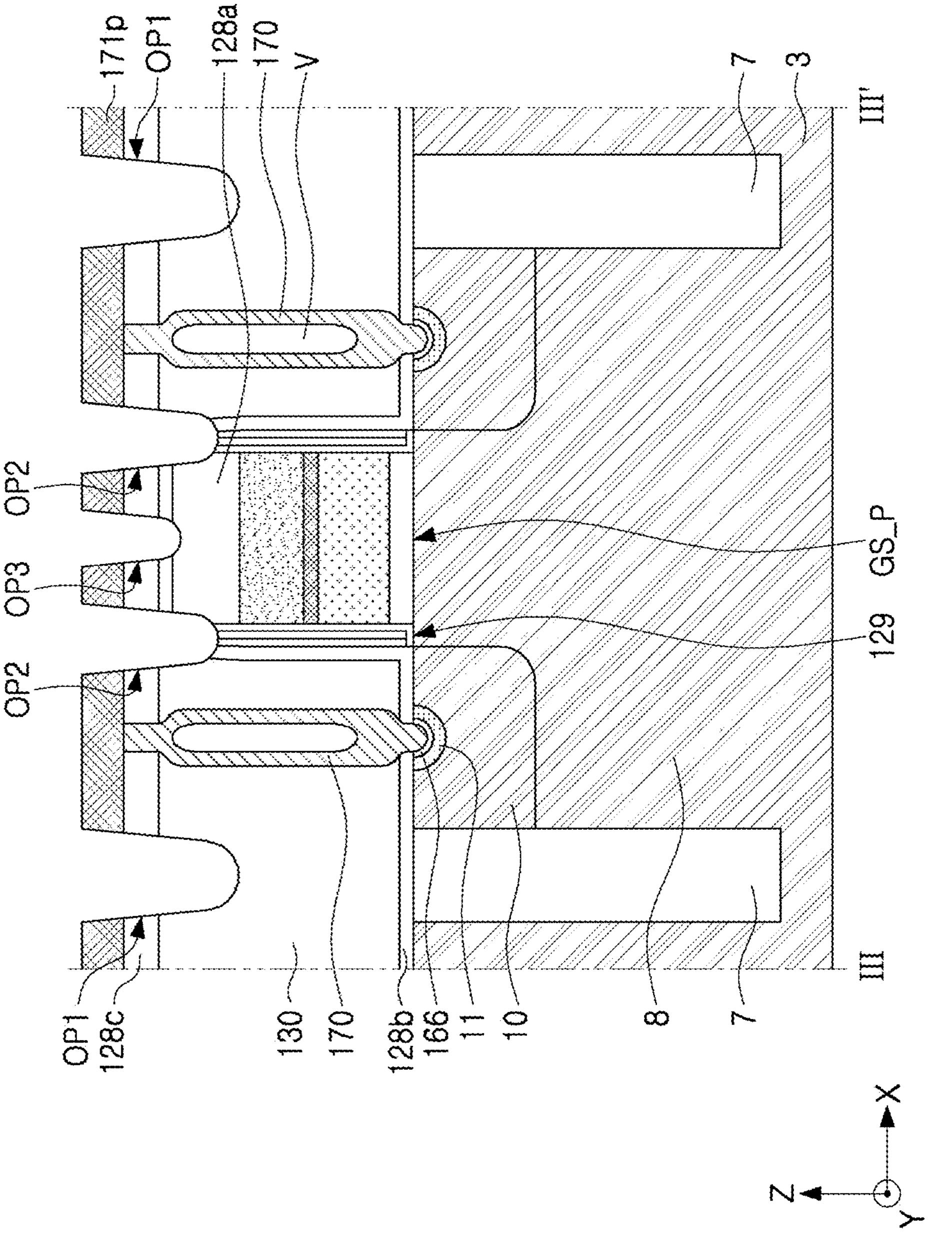

Referring to FIGS. 15A and 15B, the lower landing pad 70 and the preliminary upper landing pad 71*p* in the cell region CA may be patterned by an etching process. A portion of the bitline structure BLS and the spacer structure SP may be etched by the etching process. The etched preliminary upper landing pads 71*p* may be spaced apart from each other.

In the peripheral circuit region PA, a preliminary peripheral interconnection layer 171*p* may be patterned by an etching process. In an example embodiment, a first opening OP1, a second opening OP2, and a third opening OP3 may be formed by the etching process. The first opening OP1 may penetrate through the preliminary peripheral interconnection layer 171*p* and the second peripheral capping layer 128*c*, and may expose the lower interlayer insulating layer 130. The second opening OP2 may penetrate through the preliminary peripheral interconnection layer 171*p* and the second peripheral capping layer 128*c*, and may expose the first peripheral capping layer 128*b* and the peripheral gate spacer 129. The third opening OP3 may penetrate through the preliminary peripheral interconnection layer 171*p* and the second peripheral capping layer 128*c*, and may expose the first peripheral capping layer 128*b* and the peripheral gate capping layer 128A.

In an example embodiment, the horizontal width and the depth of the first opening OP1, the second opening OP2, and the third opening OP3 may be different from each other. For example, the first opening OP1 having the largest width may be formed to be the deepest, and the third opening OP3 having the smallest width may be formed to be the shallowest. In the plan diagram, the first opening OP1, the second opening OP2, and the third opening OP3 may have a line-and-space shape.

Figure 16A:
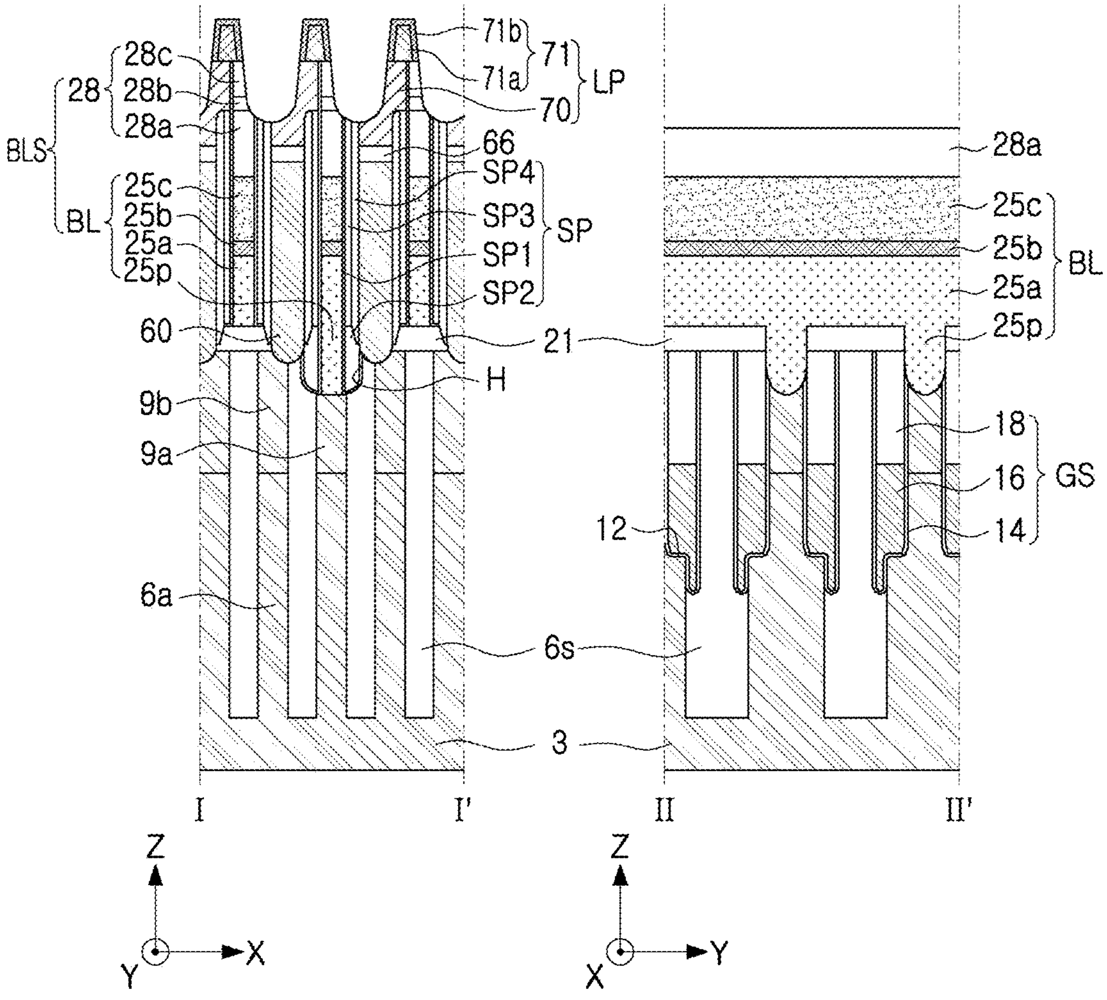
Figure 16B:
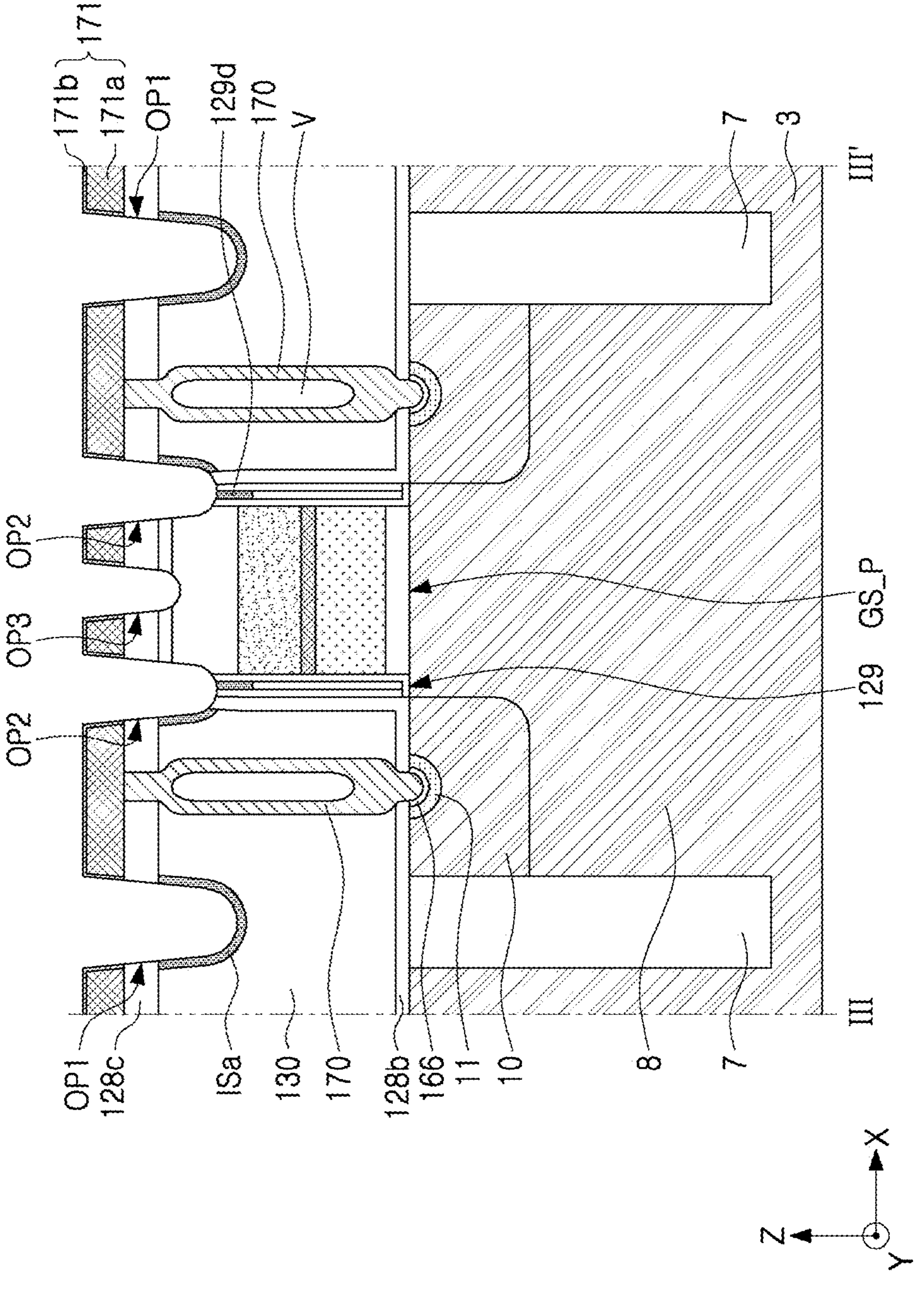

Referring to FIGS. 16A and 16B, a nitridation process may be performed. The nitridation process may include supplying $NH_3$ gas. In an example embodiment, in the cell region CA, the upper landing pad 71 may be formed by partially nitriding a surface of the preliminary upper landing pad 71*p*. The upper landing pad 71 may include the metal layer 71*a* and the metal nitride layer 71*b*. The metal layer 71*a* may include tungsten (W), and the metal nitride layer 71*b* may include tungsten nitride (WN). Although not illustrated, as described with reference to FIG. 4, a portion of the second spacer SP2 of the spacer structure SP may be nitrided.

In the peripheral circuit region PA, a portion of the lower interlayer insulating layer 130 may be nitrided. For example, the mixture layer ISa may be formed by nitriding a portion of the lower interlayer insulating layer 130 exposed by the first opening OP1 and the second opening OP2. Also, the mixture layer 129*d* may be formed by nitriding a portion of the peripheral gate spacer 129 exposed by the second opening OP2. In the mixture layer ISa formed on the lower interlayer insulating layer 130 and the mixture layer 129*d* formed on the peripheral gate spacer 129, silicon oxide and silicon nitride may be mixed.

In the peripheral circuit region PA, the peripheral interconnection layer 171 may be formed by partially nitriding the preliminary peripheral interconnection layer 171*p*. For example, a portion of the preliminary peripheral interconnection layer 171*p* and a surface of the preliminary peripheral interconnection layer 171*p* exposed by the first opening OP1, the second opening OP2, and the third opening OP3 may be partially nitrided. The peripheral interconnection layer 171 may include the metal layer 171*a* and the metal nitride layer 171*b*. The metal layer 171*a* may include tungsten (W), and the metal nitride layer 171*b* may include tungsten nitride (WN).

Figure 17A:
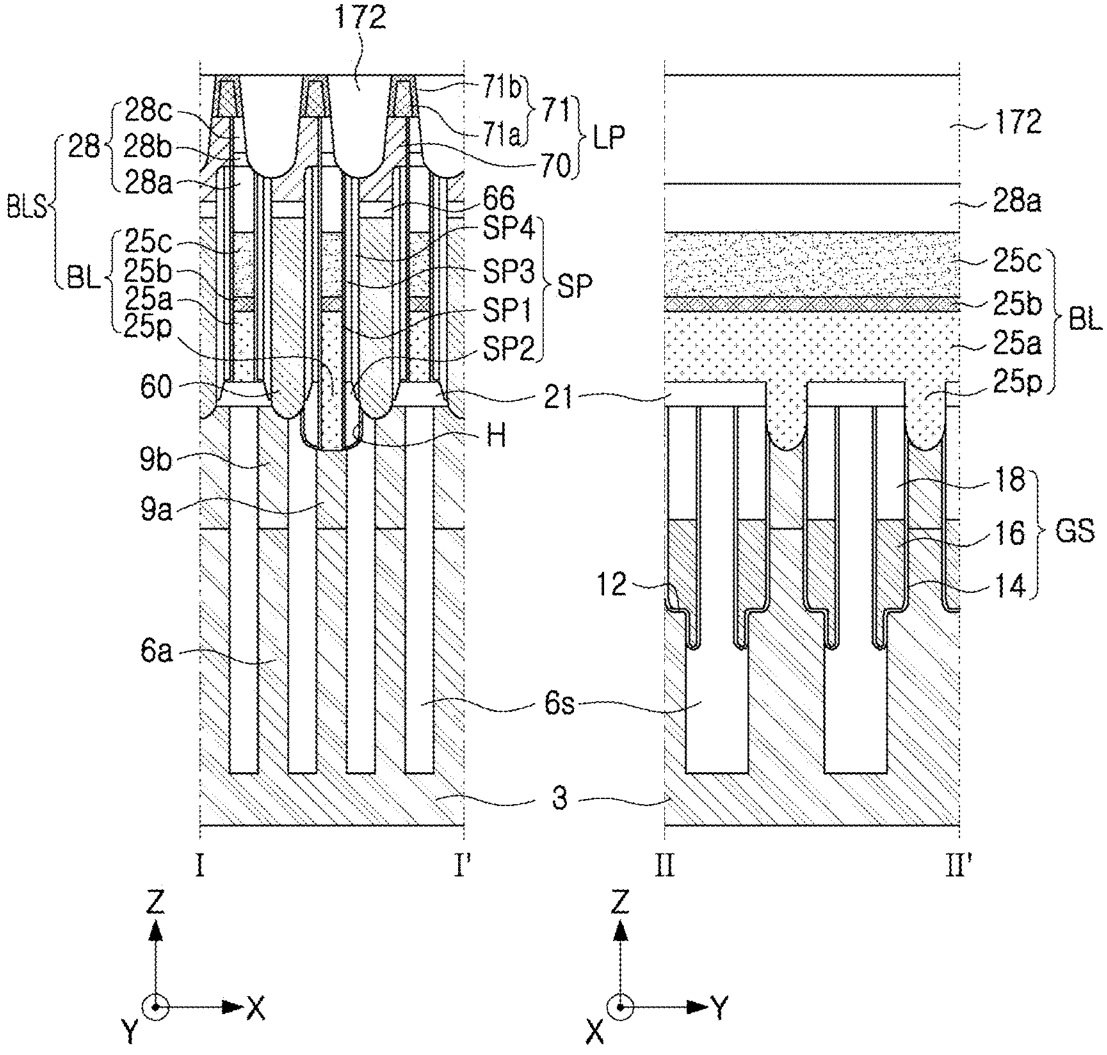
Figure 17B:
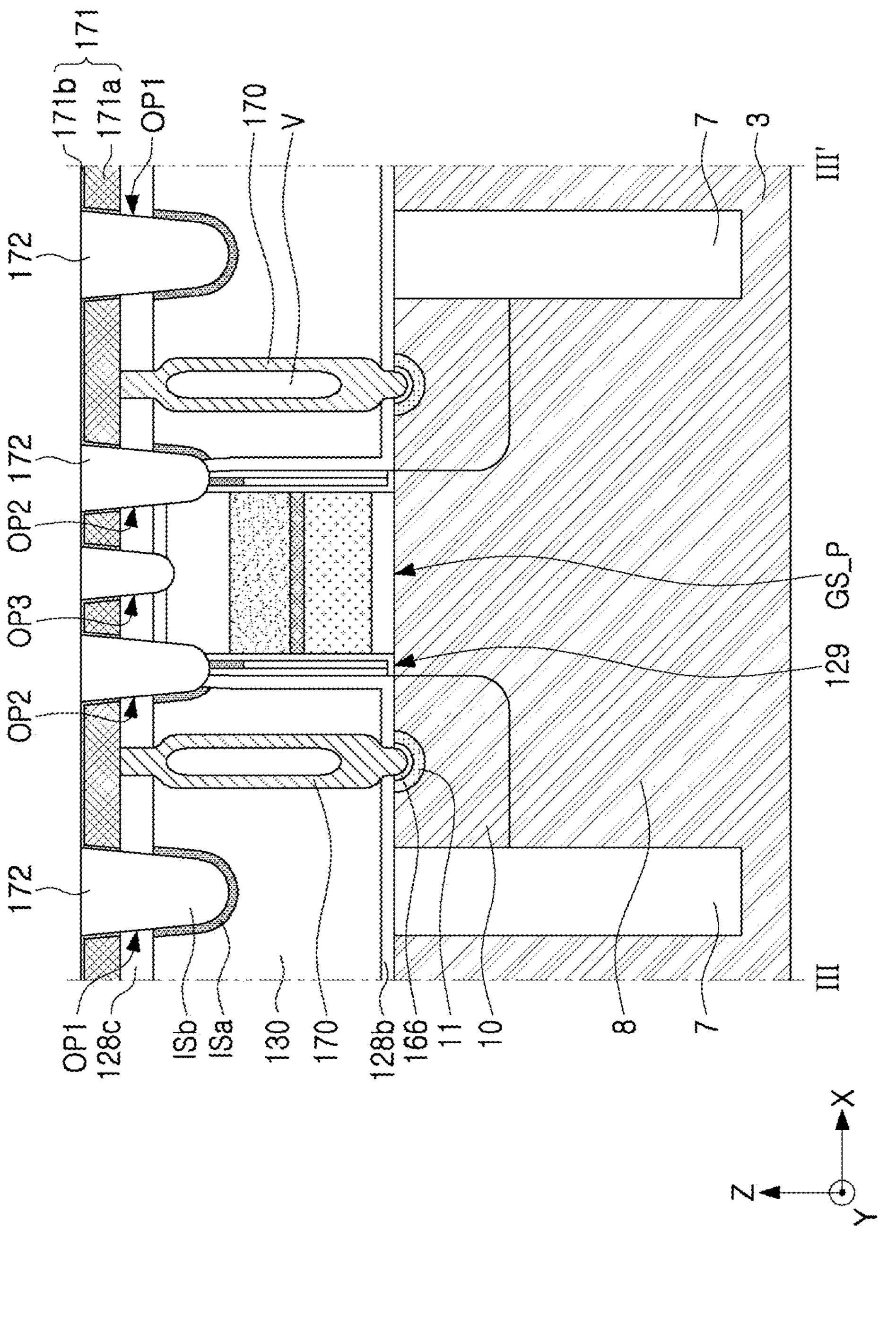

Referring to FIGS. 17A and 17B, the insulating layer 172 may be formed in the cell region CA and the peripheral circuit region PA. In the cell region CA, the insulating layer 172 may fill a space between the lower landing pads 70 and the upper landing pads 71. In the peripheral circuit region PA, the insulating layer 172 may fill the first opening OP1, the second opening OP2, and the third opening OP3. After the insulating layer 172 is formed, upper surfaces of the upper landing pad 71 and the peripheral interconnection layer 171 may be exposed by a planarization process or an etching process.

Figure 18A:
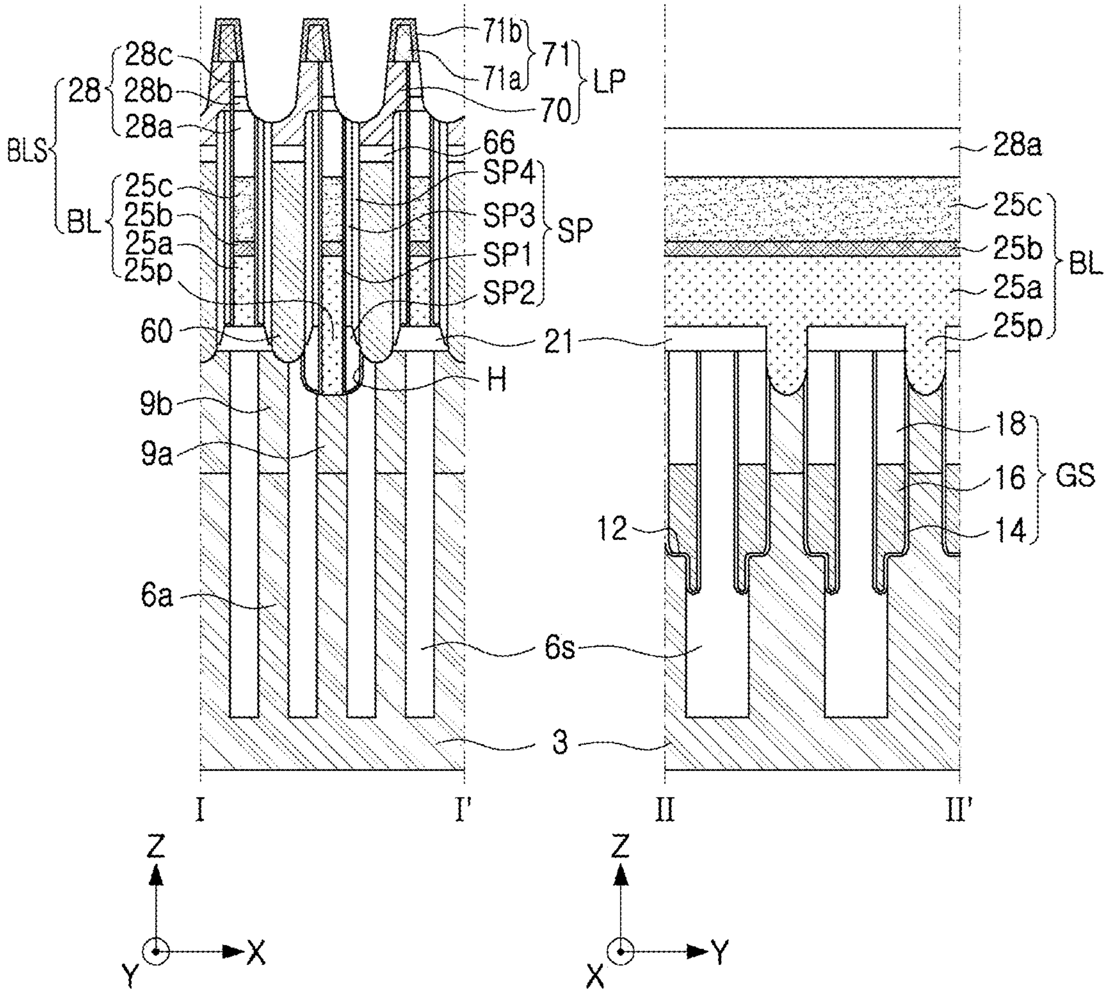
Figure 18B:
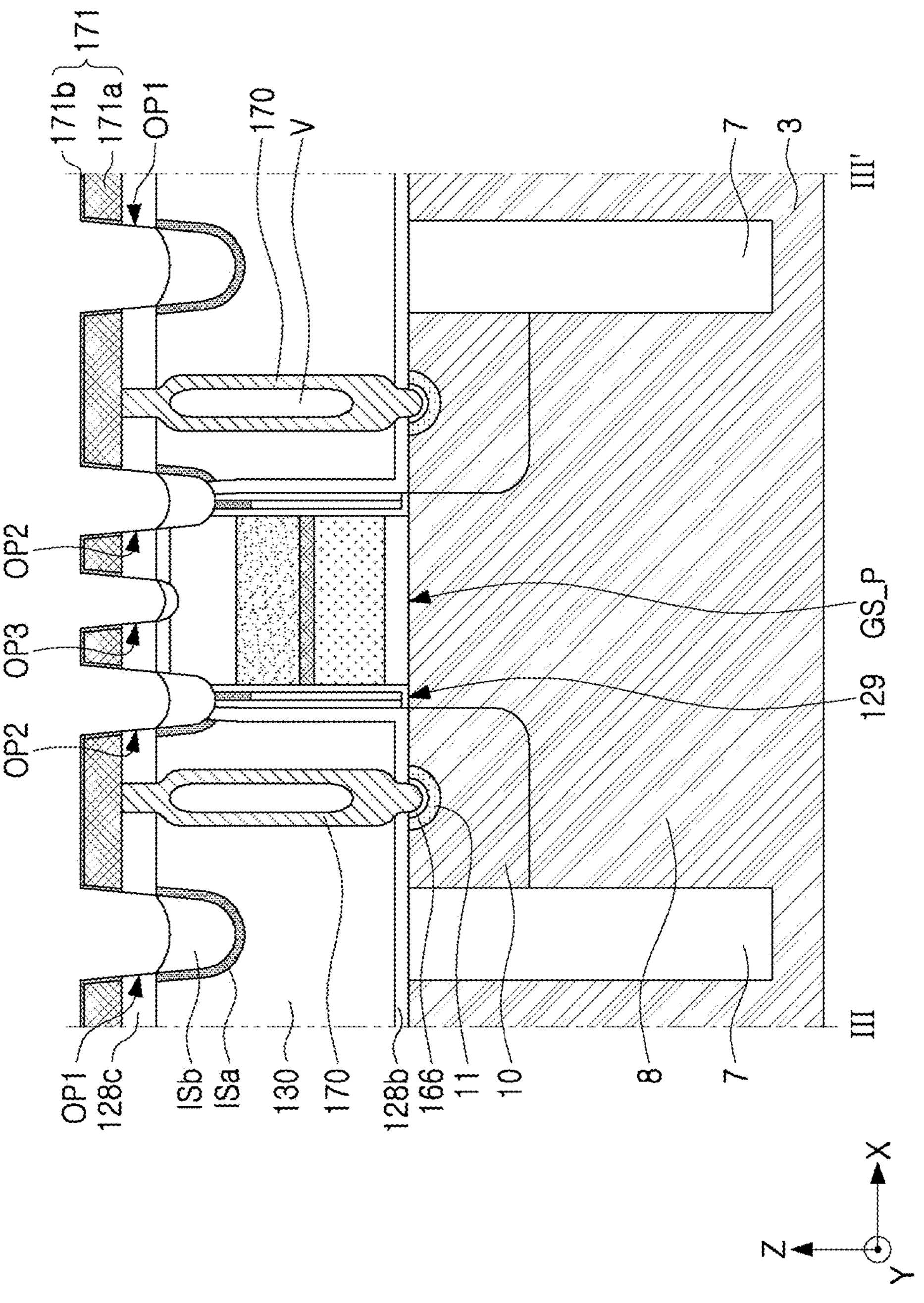

Referring to FIGS. 18A and 18B, in the cell region CA, the insulating layer 172 may be entirely removed by an etching process, and the bitline structure BLS, the spacer structure SP, and the lower landing pad 70 may be exposed.

In the peripheral circuit region PA, the insulating layer 172 may be etched by the etching process, but may not be entirely removed and may remain, thereby forming the first peripheral insulating layer ISb. The first peripheral insulating layer ISb may partially fill the first opening OP1, the second opening OP2, and the third opening OP3. For example, the upper end of the first peripheral insulating layer ISb formed on the first opening OP1, the second opening OP2, and the third opening OP3 may be disposed on the same level in the example in the diagram. In another example, an etchant may further flow into the first opening OP1 having a relatively wide horizontal width, and a level of the first peripheral insulating layer ISb formed in the first opening OP1 may be relatively lower.

Figure 19A:
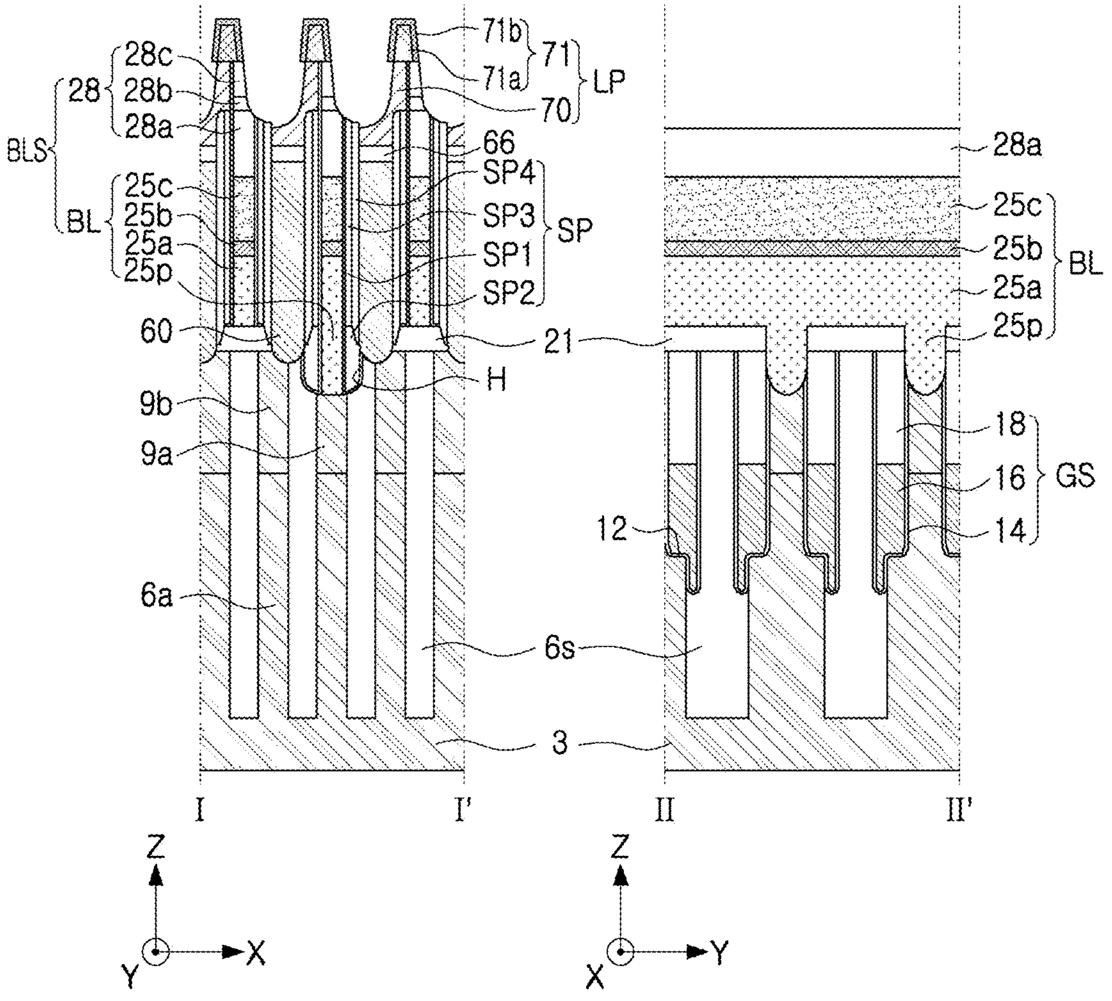
Figure 19B:
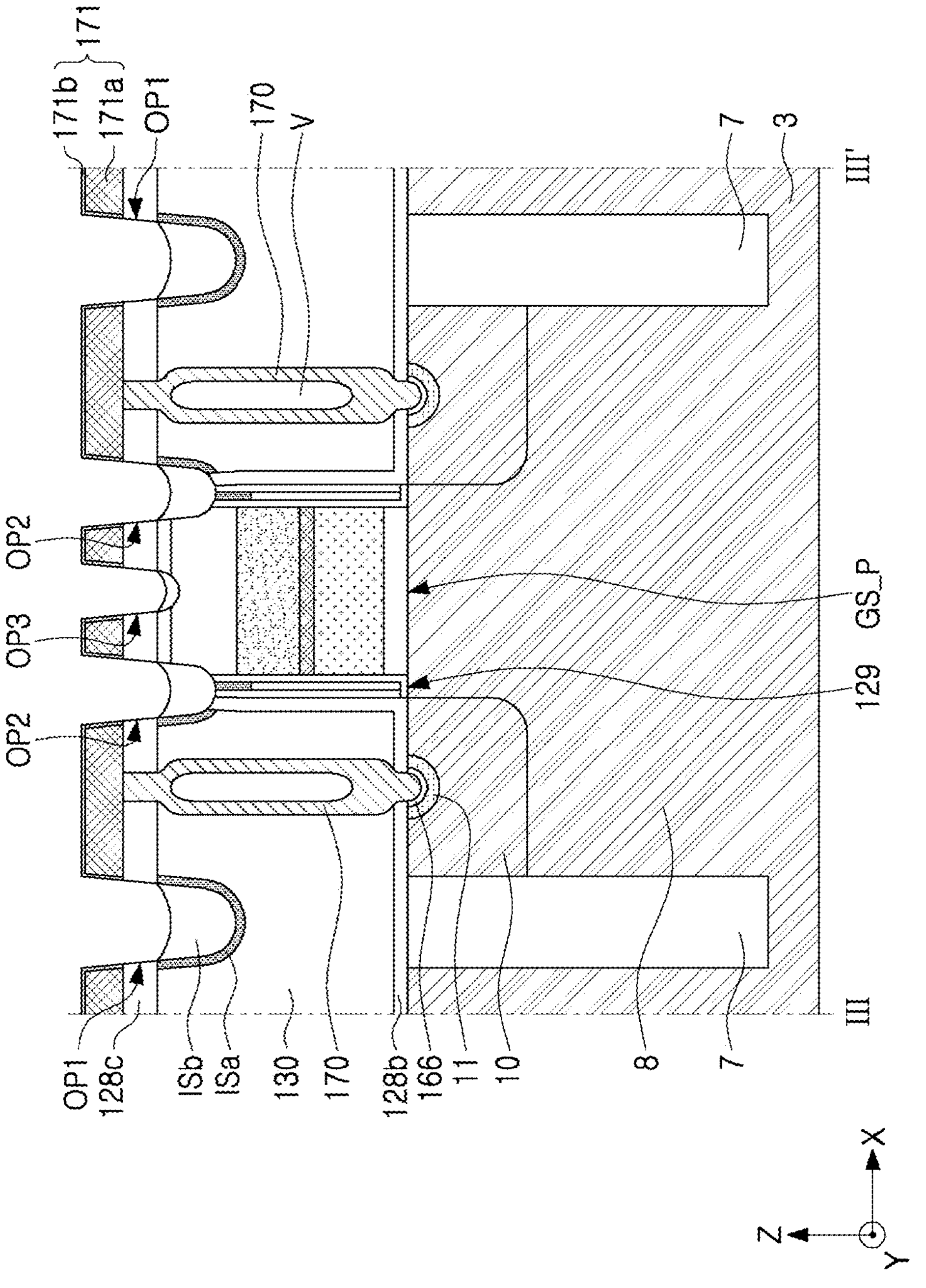

Referring to FIGS. 19A and 19B, the lower landing pad 70 may be etched in the cell region CA. In an example embodiment, the etching of the lower landing pad 70 may include a cleaning process. The cleaning process may include providing $NF_3$ gas. The lower landing pad 70 may be selectively etched by the cleaning process. Accordingly, in the etching process described with reference to FIG. 15A, even when the lower landing pad 70 is not sufficiently etched, the lower landing pad 70 may be etched by the cleaning process, such that the lower landing pads 70 may be connected to each other such that electrical shorts may be prevented. Accordingly, process dispersion in the process of manufacturing the semiconductor device 100 may be reduced, and defects of the semiconductor device 100 may be prevented and reduced.

In the peripheral circuit region PA, even when the cleaning process is performed, since the first peripheral insulating layer ISb formed along the first opening OP1, the second opening OP2, and the third opening OP3 may protect the lower interlayer insulating layer 130, the lower interlayer insulating layer 130 may not be etched.

Figure 20A:
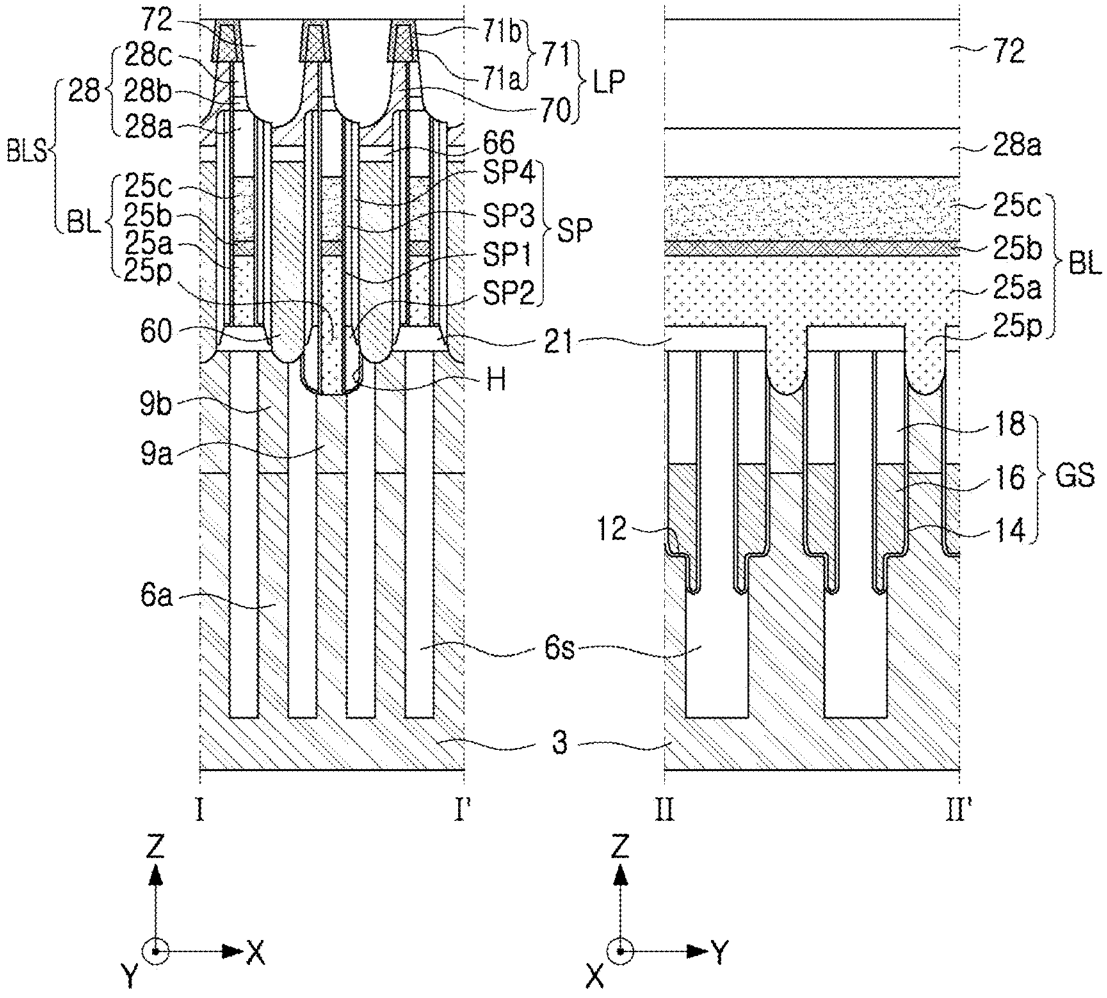
Figure 20B:
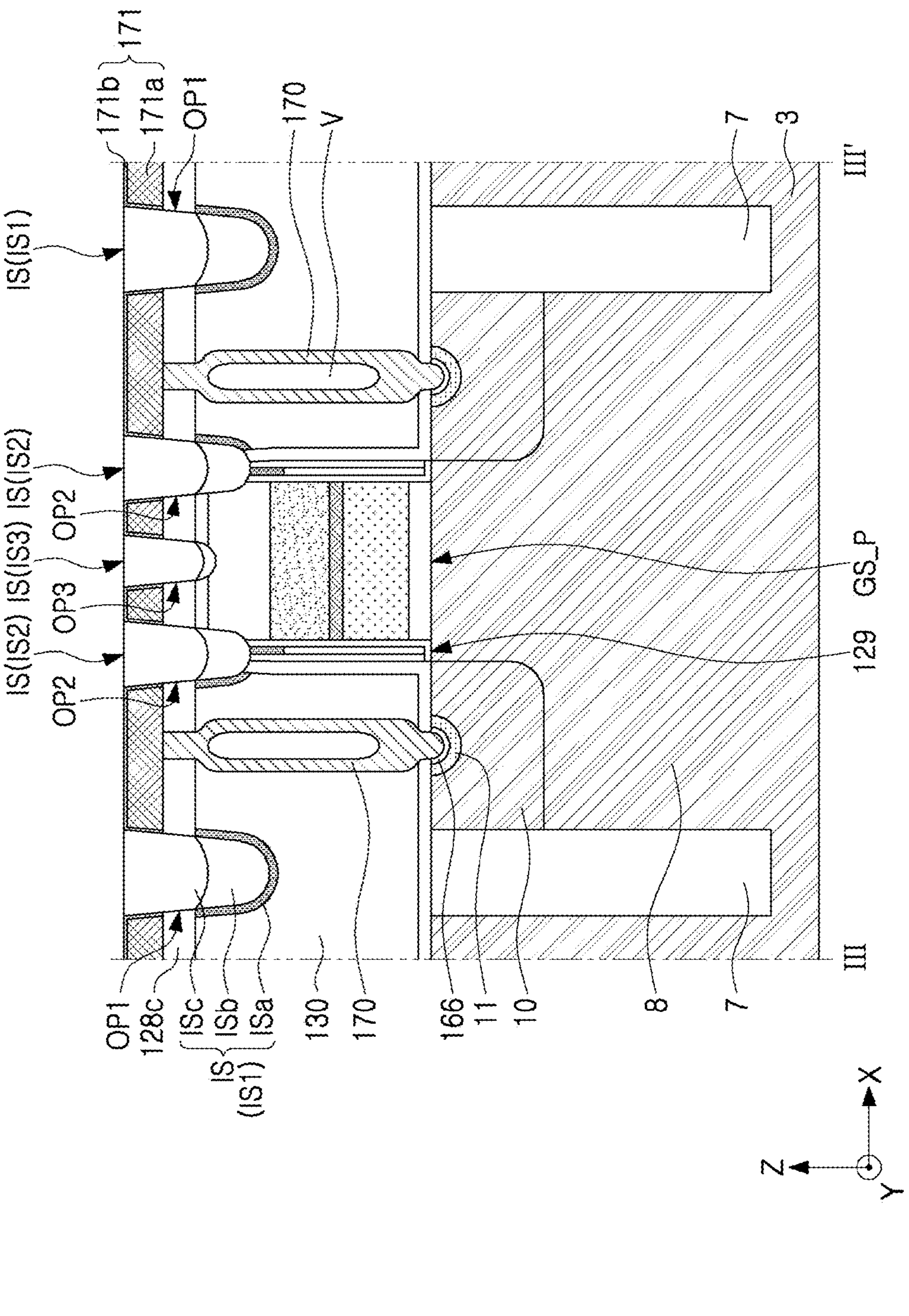

Referring to FIGS. 20A and 20B, the cell insulating pattern 72 may be formed between the lower landing pads 70 and the upper landing pads 71 in the cell region CA. The cell insulating pattern 72 may be formed by forming an insulating material to cover the lower landing pad 70 and etching the insulating material to expose the upper landing pad 71. The cell insulating pattern 72 may electrically insulate adjacent lower landing pads 70 and upper landing pads 71 from each other.

In the peripheral circuit region PA, the second peripheral insulating layer ISc may be formed on the first peripheral insulating layer ISb. The second peripheral insulating layer ISc may be formed simultaneously with the cell insulating pattern 72. For example, the second peripheral insulating layer ISc may be formed by forming an insulating material to cover the first peripheral insulating layer ISb and the peripheral interconnection layer 171, and etching the insulating material to expose the peripheral interconnection layer 171. The first peripheral insulating layer ISb, the second peripheral insulating layer ISc, and the mixture layer ISa covering a lower surface of the first peripheral insulating layer ISb formed in the first opening OP1 may form the first peripheral insulating structure IS1. The mixture layer ISa, the first peripheral insulating layer ISb, and the second peripheral insulating layer ISc disposed in a position corresponding to the second opening OP2 may form the second peripheral insulating structure IS2. The first peripheral insulating layer ISb and the second peripheral insulating layer ISc disposed in positions corresponding to the third opening OP3 may form the third peripheral insulating structure IS3.

Referring again to FIGS. 3A and 3B, the etch stop layer 75 and the capacitor structure 80 may be formed on the cell insulating pattern 72 and the upper landing pad 71 in the cell region CA. The etch stop layer 75 may be formed to cover the cell insulating pattern 72 and the upper landing pad 71, and the lower electrode 82 may penetrate through the etch stop layer 75 and may be in contact with the upper landing pad 71. The capacitor dielectric layer 84 may be formed on the etch stop layer 75 and the lower electrode 82, and the upper electrode 86 may be formed on the capacitor dielectric layer 84. The lower electrode 82, the capacitor dielectric layer 84, and the upper electrode 86 may form the capacitor structure 80.

In the peripheral circuit region PA, the peripheral etch stop layer 175, the upper interlayer insulating layer 180, and the peripheral contact structure MC may be formed to complete manufacturing of the semiconductor device 100. The peripheral etch stop layer 175 may be formed to cover the peripheral interconnection layer 171 and the peripheral insulating structure IS. The upper interlayer insulating layer 180 may be formed on the peripheral etch stop layer 175. The peripheral contact structure MC may be formed to penetrate through the peripheral etch stop layer 175 and the upper interlayer insulating layer 180 and to be in contact with the peripheral interconnection layer 171.

Figure 21:
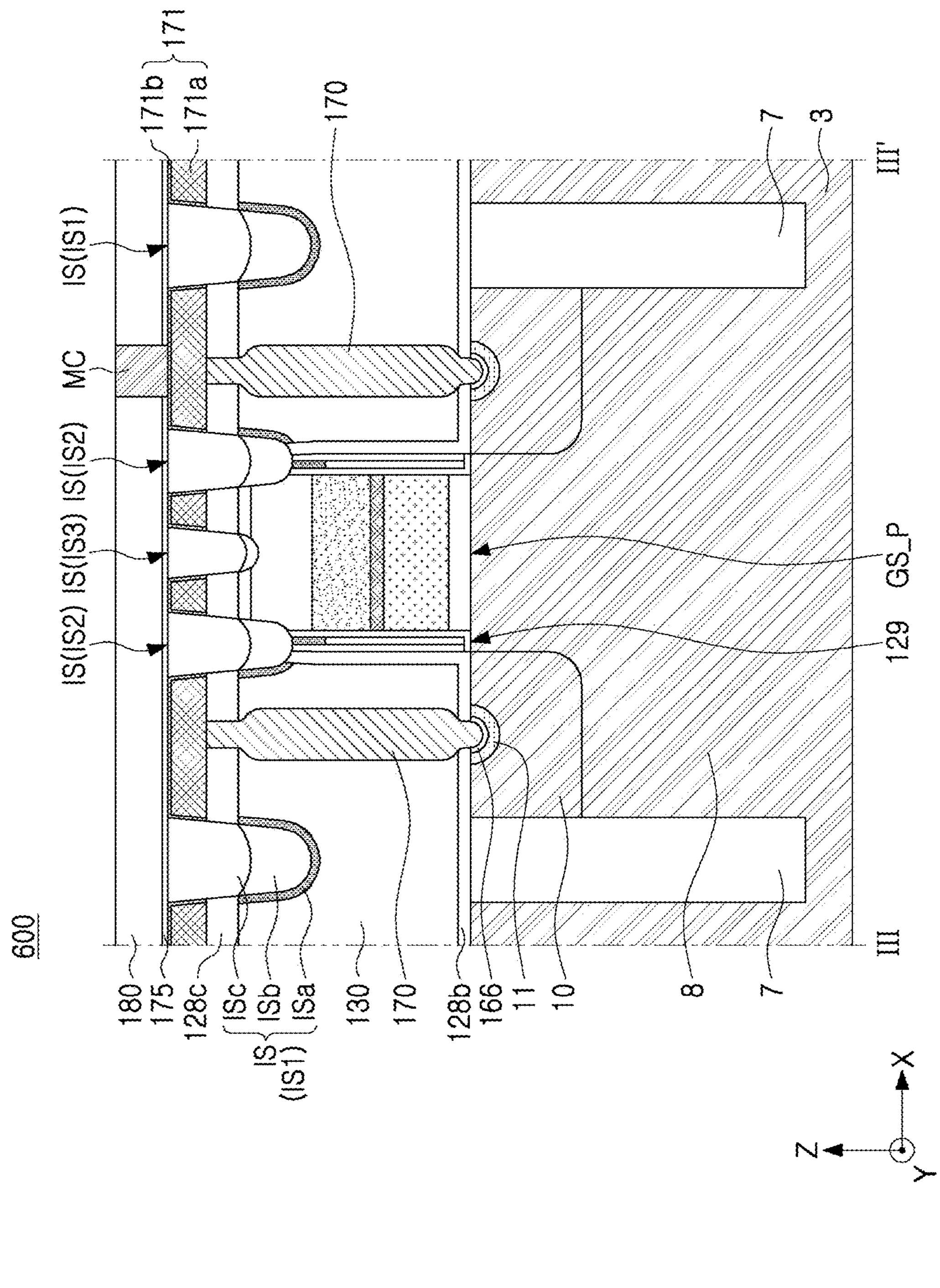
FIG. 21 is a cross-sectional view illustrating a semiconductor device according to an example embodiment.

FIG. 21 is a cross-sectional diagram illustrating a semiconductor device according to an example embodiment.

Referring to FIG. 21, a semiconductor device 600 may include the peripheral contact plug 170 disposed adjacent to the peripheral gate structure GS_P and electrically connected to the first peripheral impurity region 10 and the second peripheral impurity region 11. In an example embodiment, differently from the semiconductor device 100 illustrated in FIG. 3B, the peripheral contact plug 170 may not include a void V therein. The peripheral contact plug 170 may be completely filled with a conductive material, e.g., titanium nitride (TiN).

By way of summation and review, an example embodiment provides a semiconductor device including a peripheral insulating structure penetrating through a peripheral interconnection layer. That is, according to the aforementioned example embodiments, the peripheral insulating structure may be formed on a lower interlayer insulating layer and may include a mixture layer, a first peripheral insulating layer, and a second peripheral insulating layer. Accordingly, excessive etching of the lower interlayer insulating layer may be prevented, and defects of the semiconductor device may be prevented or substantially reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a cell region and a peripheral circuit region;
bitline structures on the cell region;
a contact plug between the bitline structures;
a landing pad structure on the contact plug;
a peripheral gate structure on the peripheral circuit region;
a lower interlayer insulating layer covering a side surface of the peripheral gate structure;
a peripheral contact plug penetrating through the lower interlayer insulating layer;
a plurality of peripheral interconnection layers on the lower interlayer insulating layer and the peripheral contact plug; and
a plurality of peripheral insulating structures passing between the plurality of peripheral interconnection layers,
wherein the plurality of peripheral insulating structures include a first peripheral insulating structure partially penetrating through the lower interlayer insulating layer, and
wherein the first peripheral insulating structure includes a first peripheral insulating layer, a second peripheral insulating layer on the first peripheral insulating layer and passing between the plurality of peripheral interconnection layers, and a mixture layer between the lower interlayer insulating layer and the first peripheral insulating layer.

2. The semiconductor device as claimed in claim 1, wherein the lower interlayer insulating layer and the first peripheral insulating layer include silicon oxide, and the second peripheral insulating layer includes silicon nitride.

3. The semiconductor device as claimed in claim 1, wherein:
the mixture layer of the first peripheral insulating structure includes silicon oxide and silicon nitride, and
a ratio of silicon nitride to silicon oxide in the mixture layer of the first peripheral insulating structure varies depending on a depth from an upper surface of the mixture layer.

4. The semiconductor device as claimed in claim 1, wherein a lower end of the first peripheral insulating structure is on a lower level than an upper surface of the peripheral gate structure.

5. The semiconductor device as claimed in claim 1, wherein:
each of the plurality of peripheral interconnection layers includes a metal layer and a metal nitride layer, and
the metal nitride layer covers the metal layer and extends along an upper surface and a side surface of each of the plurality of peripheral interconnection layers.

6. The semiconductor device as claimed in claim 1, further comprising a peripheral gate spacer covering a side surface of the peripheral gate structure, the plurality of peripheral insulating structures including a second peripheral insulating structure partially penetrating through the peripheral gate spacer.

7. The semiconductor device as claimed in claim 6, wherein the second peripheral insulating structure includes a first peripheral insulating layer, a second peripheral insulating layer on the first peripheral insulating layer and passing between the plurality of peripheral interconnection layers, and a mixture layer between the lower interlayer insulating layer and the first peripheral insulating layer.

8. The semiconductor device as claimed in claim 6, wherein:
a depth of the first peripheral insulating structure is greater than a depth of the second peripheral insulating structure, and
an upper end of the first peripheral insulating layer of the first peripheral insulating structure is on a lower level than an upper end of the first peripheral insulating layer of the second peripheral insulating structure.

9. The semiconductor device as claimed in claim 6, wherein the peripheral gate spacer includes a mixture layer in contact with the second peripheral insulating structure.

10. The semiconductor device as claimed in claim 9, wherein:
the mixture layer of the peripheral gate spacer includes silicon oxide and silicon nitride, and
a ratio of silicon nitride to silicon oxide in the mixture layer of the peripheral gate spacer varies depending on a depth from an upper surface of the mixture layer.

11. The semiconductor device as claimed in claim 1, wherein:
the plurality of peripheral insulating structures include a third peripheral insulating structure partially penetrating through the peripheral gate structure, and
the third peripheral insulating structure includes a first peripheral insulating layer in contact with the peripheral gate structure, and a second peripheral insulating layer on the first peripheral insulating layer and including a material different from a material of the first peripheral insulating layer.

12. The semiconductor device as claimed in claim 1, wherein:
the peripheral contact plug includes a void, and
a lower end of the first peripheral insulating structure is on a lower level than an upper end of the void.

13. The semiconductor device as claimed in claim 1, further comprising a peripheral capping layer between the lower interlayer insulating layer and at least one of the plurality of peripheral interconnection layers, the peripheral capping layer including a material different from a material of the lower interlayer insulating layer.

14. The semiconductor device as claimed in claim 1, wherein the peripheral contact plug includes a same material as a material of at least one of the plurality of peripheral interconnection layers and is integral with the at least one of the plurality of peripheral interconnection layers.

15. A semiconductor device, comprising:
a substrate including a cell region and a peripheral circuit region;
bitline structures on the cell region;
a first contact plug and a second contact plug between the bitline structures and spaced apart from each other;
a spacer structure on a side surface of one of the bitline structures and in contact with the second contact plug;
a first landing pad structure on the first contact plug and including a first lower landing pad and a first upper landing pad on the first lower landing pad;
a second landing pad structure on the second contact plug and including a second lower landing pad and a second upper landing pad on the second lower landing pad;
a cell insulating pattern between the first landing pad structure and the second landing pad structure;
a peripheral gate structure on the peripheral circuit region;
a lower interlayer insulating layer covering a side surface of the peripheral gate structure;
a peripheral contact plug penetrating through the lower interlayer insulating layer;

a plurality of peripheral interconnection layers on the lower interlayer insulating layer and the peripheral contact plug; and a plurality of peripheral insulating structures passing between the plurality of peripheral interconnection layers and partially penetrating through the lower interlayer insulating layer, wherein a lower surface of the cell insulating pattern includes a first portion in contact with an upper surface of the spacer structure and a second portion in contact with the second lower landing pad, and wherein a lower end of the second portion of the cell insulating pattern is disposed on a lower level than a lower end of the first portion of the cell insulating pattern.

16. The semiconductor device as claimed in claim 15, wherein:

a side surface of the cell insulating pattern protrudes toward the second lower landing pad in which the second lower landing pad and the second upper landing pad are in contact with each other, and the cell insulating pattern is in contact with a lower surface of the second upper landing pad.

17. The semiconductor device as claimed in claim 16, wherein the cell insulating pattern is in contact with a side surface of the first upper landing pad and is not in contact with a lower surface of the first upper landing pad.

18. The semiconductor device as claimed in claim 15, wherein a side surface of the spacer structure is in contact with the second lower landing pad and the cell insulating pattern.

19. The semiconductor device as claimed in claim 15, wherein:

the first upper landing pad includes a metal layer and a metal nitride layer, and the metal nitride layer covers the metal layer and extends along an upper surface and a side surface of the first upper landing pad.

20. A semiconductor device, comprising:

a substrate including a cell region and a peripheral circuit region;

a first active region on the substrate in the cell region;

a cell gate structure in the substrate in the cell region, intersecting the first active region, and extending in a first horizontal direction;

bitline structures intersecting the cell gate structure and extending in a second horizontal direction intersecting the first horizontal direction;

a contact plug between the bitline structures;

a landing pad structure on the contact plug and including a lower landing pad and an upper landing pad on the lower landing pad;

a peripheral gate structure on the peripheral circuit region;

a lower interlayer insulating layer covering a side surface of the peripheral gate structure;

a peripheral contact plug penetrating through the lower interlayer insulating layer;

a plurality of peripheral interconnection layers on the lower interlayer insulating layer and the peripheral contact plug; and a plurality of peripheral insulating structures passing between the plurality of peripheral interconnection layers, wherein the plurality of peripheral insulating structures include a first peripheral insulating structure partially penetrating through the lower interlayer insulating layer, wherein the first peripheral insulating structure includes a first peripheral insulating layer, a second peripheral insulating layer on the first peripheral insulating layer and penetrating through the plurality of peripheral interconnection layers, and a mixture layer between the lower interlayer insulating layer and the first peripheral insulating layer, wherein the lower interlayer insulating layer and the first peripheral insulating layer include silicon oxide, and wherein the mixture layer and the second peripheral insulating layer include silicon nitride.

* * * * *